(12) United States Patent
Tsai et al.

(10) Patent No.: US 12,142,490 B2
(45) Date of Patent: Nov. 12, 2024

(54) PERFORMING ANNEALING PROCESS TO IMPROVE FIN QUALITY OF A FinFET SEMICONDUCTOR

(71) Applicant: Taiwan Semiconductor Manufacturing Co., Ltd., Hsin-Chu (TW)

(72) Inventors: Tzung-Yi Tsai, Taoyuan (TW); Yen-Ming Chen, Chu-Pei (TW); Tsung-Lin Lee, Hsinchu (TW); Po-Kang Ho, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 127 days.

(21) Appl. No.: 17/717,375

(22) Filed: Apr. 11, 2022

(65) Prior Publication Data

US 2022/0238350 A1 Jul. 28, 2022

Related U.S. Application Data

(62) Division of application No. 16/158,802, filed on Oct. 12, 2018, now Pat. No. 11,302,535.

(Continued)

(51) Int. Cl.
*H01L 21/32* (2006.01)
*H01L 21/324* (2006.01)
(Continued)

(52) U.S. Cl.
CPC ...... *H01L 21/324* (2013.01); *H01L 21/76832* (2013.01); *H01L 29/161* (2013.01);
(Continued)

(58) Field of Classification Search
CPC ......... H01L 29/66795; H01L 29/66545; H01L 29/785; H01L 21/823821; H01L 29/7851
See application file for complete search history.

(56) References Cited

U.S. PATENT DOCUMENTS 7,425,740 B2 9/2008 Liu et al.
7,667,271 B2 2/2010 Yu et al.
(Continued)

FOREIGN PATENT DOCUMENTS

| CN | 103515213 A | 1/2014 |
| KR | 100683490 A | 2/2007 |
| TW | 201628129 A | 8/2016 |

OTHER PUBLICATIONS

Lee et al., "Selective GeO$_x$-Scavenging from Interfacial Layer on Si$_1$—xGe$_x$ Channel for High Mobility Si/Si$_1$—xGe$_x$ CMOS Application", 2016 Symposium on VLSI Technology Digest of Technical Papers, 2 pgs. (2016).

*Primary Examiner* — Tony Tran
(74) *Attorney, Agent, or Firm* — HAYNES AND BOONE, LLP

(57) ABSTRACT

A semiconductor device is provided. The semiconductor device has a fin structure that protrudes vertically upwards. A lateral dimension of the fin structure is reduced. A semiconductor layer is formed on the fin structure after the reducing of the lateral dimension. An annealing process is performed to the semiconductor device after the forming of the semiconductor layer. A dielectric layer is formed over the fin structure after the performing of the annealing process.

17 Claims, 19 Drawing Sheets

Related U.S. Application Data

(60) Provisional application No. 62/690,614, filed on Jun. 27, 2018.

(51) Int. Cl.
*H01L 21/768* (2006.01)
*H01L 29/161* (2006.01)
*H01L 29/51* (2006.01)
*H01L 29/66* (2006.01)
*H01L 29/78* (2006.01)

(52) U.S. Cl.
CPC ...... *H01L 29/517* (2013.01); *H01L 29/66545* (2013.01); *H01L 29/66795* (2013.01); *H01L 29/785* (2013.01)

(56) References Cited

U.S. PATENT DOCUMENTS

| | | | |
|---|---|---|---|
| 7,910,453 B2 | 3/2011 | Xu et al. |
| 8,048,723 B2 | 11/2011 | Chang et al. |
| 8,053,299 B2 | 11/2011 | Xu |
| 8,183,627 B2 | 5/2012 | Currie |
| 8,362,575 B2 | 1/2013 | Kwok et al. |
| 8,367,498 B2 | 2/2013 | Chang et al. |
| 8,377,779 B1 | 2/2013 | Wang |
| 8,399,931 B2 | 3/2013 | Liaw et al. |
| 8,415,718 B2 | 4/2013 | Xu |
| 8,440,517 B2 | 5/2013 | Lin et al. |
| 8,487,378 B2 | 7/2013 | Goto et al. |
| 8,497,177 B1 | 7/2013 | Chang et al. |
| 8,497,528 B2 | 7/2013 | Lee et al. |
| 8,609,518 B2 | 12/2013 | Wann et al. |
| 8,610,240 B2 | 12/2013 | Lee et al. |
| 8,618,556 B2 | 12/2013 | Wu et al. |
| 8,633,516 B1 | 1/2014 | Wu et al. |
| 8,652,894 B2 | 2/2014 | Lin et al. |
| 8,680,576 B2 | 3/2014 | Ching et al. |
| 8,686,516 B2 | 4/2014 | Chen et al. |
| 8,703,565 B2 | 4/2014 | Chang et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,735,993 B2 | 5/2014 | Lo et al. |
| 8,736,056 B2 | 5/2014 | Lee et al. |
| 8,742,509 B2 | 6/2014 | Lee et al. |
| 8,772,109 B2 | 7/2014 | Colinge |
| 8,776,734 B1 | 7/2014 | Roy et al. |
| 8,785,285 B2 | 7/2014 | Tsai et al. |
| 8,796,666 B1 | 8/2014 | Huang et al. |
| 8,796,759 B2 | 8/2014 | Perng et al. |
| 8,809,139 B2 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,826,213 B1 | 9/2014 | Ho et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,887,106 B2 | 11/2014 | Ho et al. |
| 9,105,490 B2 | 8/2015 | Wang et al. |
| 9,601,514 B1 | 3/2017 | Cheng et al. |
| 9,953,836 B2 * | 4/2018 | Wen .............. H01L 29/045 |
| 2006/0076625 A1 | 4/2006 | Lee et al. |
| 2006/0084204 A1 | 4/2006 | Yin et al. |
| 2009/0269916 A1 | 10/2009 | Kang et al. |
| 2011/0068407 A1 | 3/2011 | Yeh et al. |
| 2013/0011983 A1 | 1/2013 | Tsai et al. |
| 2013/0237039 A1 | 9/2013 | Sleight et al. |
| 2013/0285153 A1 | 10/2013 | Lee et al. |
| 2014/0001574 A1 | 1/2014 | Chen et al. |
| 2014/0110755 A1 | 4/2014 | Colinge |
| 2014/0151812 A1 | 6/2014 | Liaw |
| 2014/0183600 A1 | 7/2014 | Huang et al. |
| 2014/0252412 A1 | 9/2014 | Tsai et al. |
| 2014/0264590 A1 | 9/2014 | Yu et al. |
| 2014/0264592 A1 | 9/2014 | Oxland et al. |
| 2014/0282326 A1 | 9/2014 | Chen et al. |
| 2015/0263003 A1 | 9/2015 | Lee et al. |
| 2016/0126353 A1 | 5/2016 | Jacob et al. |
| 2016/0322501 A1 | 11/2016 | Cheng |
| 2016/0379831 A1 | 12/2016 | Yeo et al. |
| 2016/0380058 A1 | 12/2016 | Basker et al. |
| 2019/0157066 A1 * | 5/2019 | Zhou .............. H01L 21/823431 |

* cited by examiner

PERFORMING ANNEALING PROCESS TO IMPROVE FIN QUALITY OF A FinFET SEMICONDUCTOR

PRIORITY DATA

This application is a divisional patent application of U.S. patent application Ser. No. 16/158,802, filed on Oct. 12, 2018, entitled "Performing Annealing Process to Improve Fin Quality of a FinFET Semiconductor", which is a utility U.S. Pat. App. of U.S. Provisional Patent Application No. 62/690,614, entitled "Performing Annealing Process to Improve Fin Quality of a FinFET Semiconductor" and filed on Jun. 27, 2018, the disclosures of each which are incorporated herein in their entireties.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, conventional FinFET devices may still have certain drawbacks. For example, conventional methods of fabricating fin structures may form fins with roughened surfaces and/or excessive germanium oxide content. This may lead to problems such as line width roughness, line edge roughness, high resistivity, low carrier mobility, defect of interface traps (DIT) defects, etc.

Therefore, although existing FinFET devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
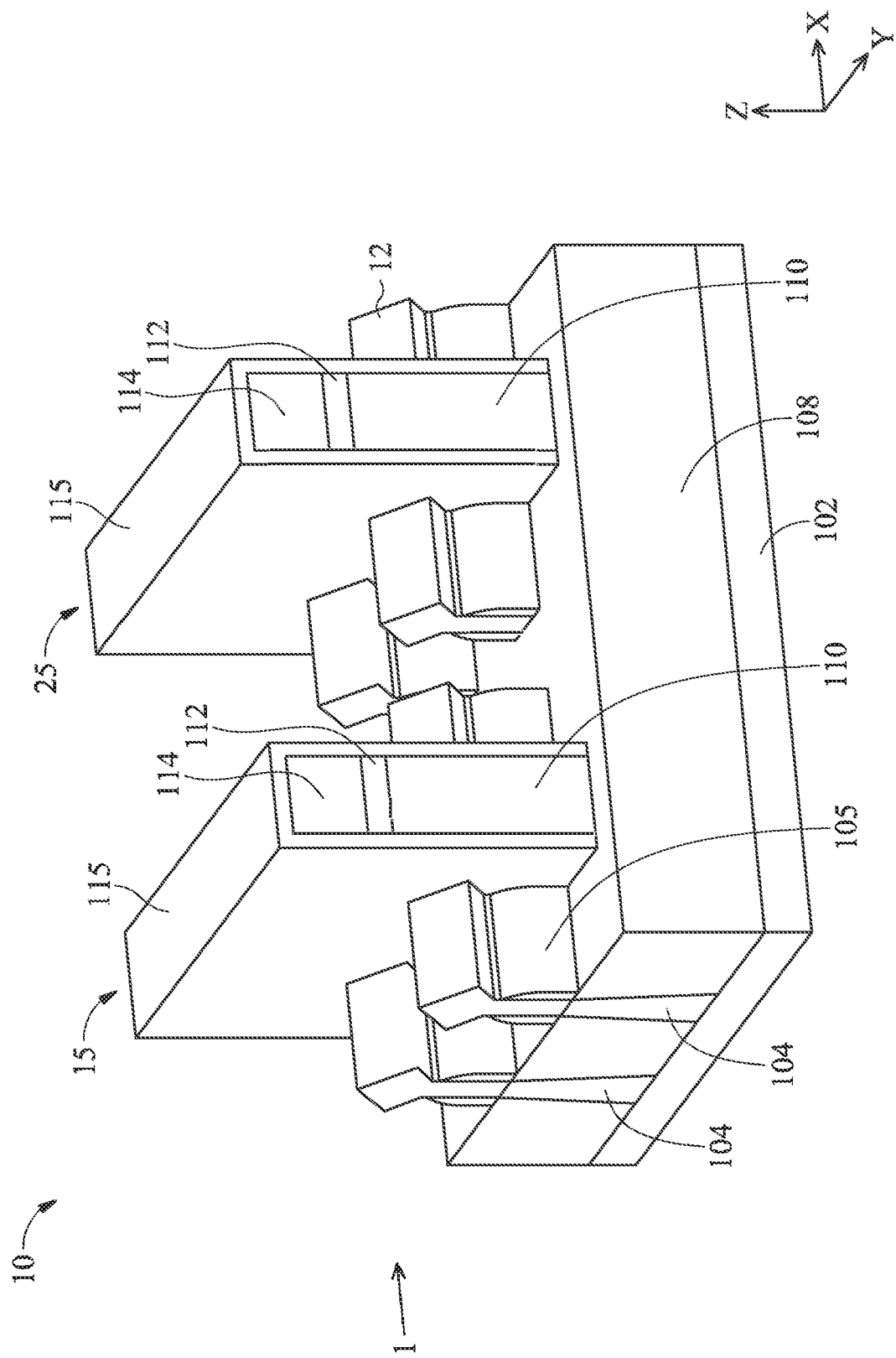
FIG. 1 is a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a method of annealing a semiconductor device to enhance the quality of the semiconductor device. To illustrate the various aspects of the present disclosure, a FinFET fabrication process is discussed below as an example. In that regard, a FinFET device is a fin-like field-effect transistor device, which has been gaining popularity in the semiconductor industry. The FinFET device may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure, but it is understood that the application is not limited to the FinFET device, except as specifically claimed.

Referring to FIG. 1, a perspective view of an example FinFET device 10 is illustrated. The FinFET device structure 10 includes an N-type FinFET device structure (NMOS) 15 and a P-type FinFET device structure (PMOS) 25. The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The FinFET device structure 10 also includes one or more fin structures 104 (e.g., Si fins) that extend from the substrate 102 in the Z-direction and surrounded by spacers 105 in the Y-direction. The fin structure 104 is elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed by a double-patterning lithography (DPL) process. DPL is a method of constructing a pattern on a substrate by dividing the pattern into two interleaved patterns. DPL allows enhanced feature (e.g., fin) density. The fin structure 104 also includes an epi-grown material 12, which may (along with portions of the fin structure 104) serve as the source/drain of the FinFET device structure 10.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 1. In other words, a portion of the fin structure 104 is embedded in the isolation structure 108. The isolation structure 108 prevents electrical interference or crosstalk.

The FinFET device structure 10 further includes a gate stack structure including a gate electrode 110 and a gate dielectric layer (not shown) below the gate electrode 110. The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). Hard mask layers 112 and 114 may be used to define the gate electrode 110. A dielectric layer 115 may also be formed on the sidewalls of the gate electrode 110 and over the hard mask layers 112 and 114.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 104. In some other embodiments, multiple gate stack structures are formed over the fin structure 104. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, FinFET fabrication may still have shortcomings. For example, the formation of the fin structures may involve one or more etching processes, which may result in rough fin surfaces. In addition, for PFETs with SiGe fin structures, a silicon cap layer may be formed on the SiGe fin structures. However, conventional FinFET devices may not have a sufficiently thick silicon cap layer. These problems may result in high line width roughness (LWR) and/or high line edge roughness (LER), as well as high resistivity and poor channel mobility. These problems are exacerbated as the semiconductor feature sizes continue to shrink—resulting in smaller critical dimensions. Consequently, semiconductor device performance may not be satisfactory.

To overcome the problems discussed above, the present disclosure performs an annealing process to repair fin surfaces in order to enhance the quality of the fin structures, as discussed below in more detail with reference to FIGS. 2-15. In that regard, FIGS. 7, 9, 11, and 13 illustrate fragmentary cross-sectional side views of a portion of a semiconductor device 200 that includes a FinFET device at various stages of fabrication, and FIG. 15 is a flowchart illustrating a method of fabricating a semiconductor device according to embodiments of the present disclosure.

Figure 2:
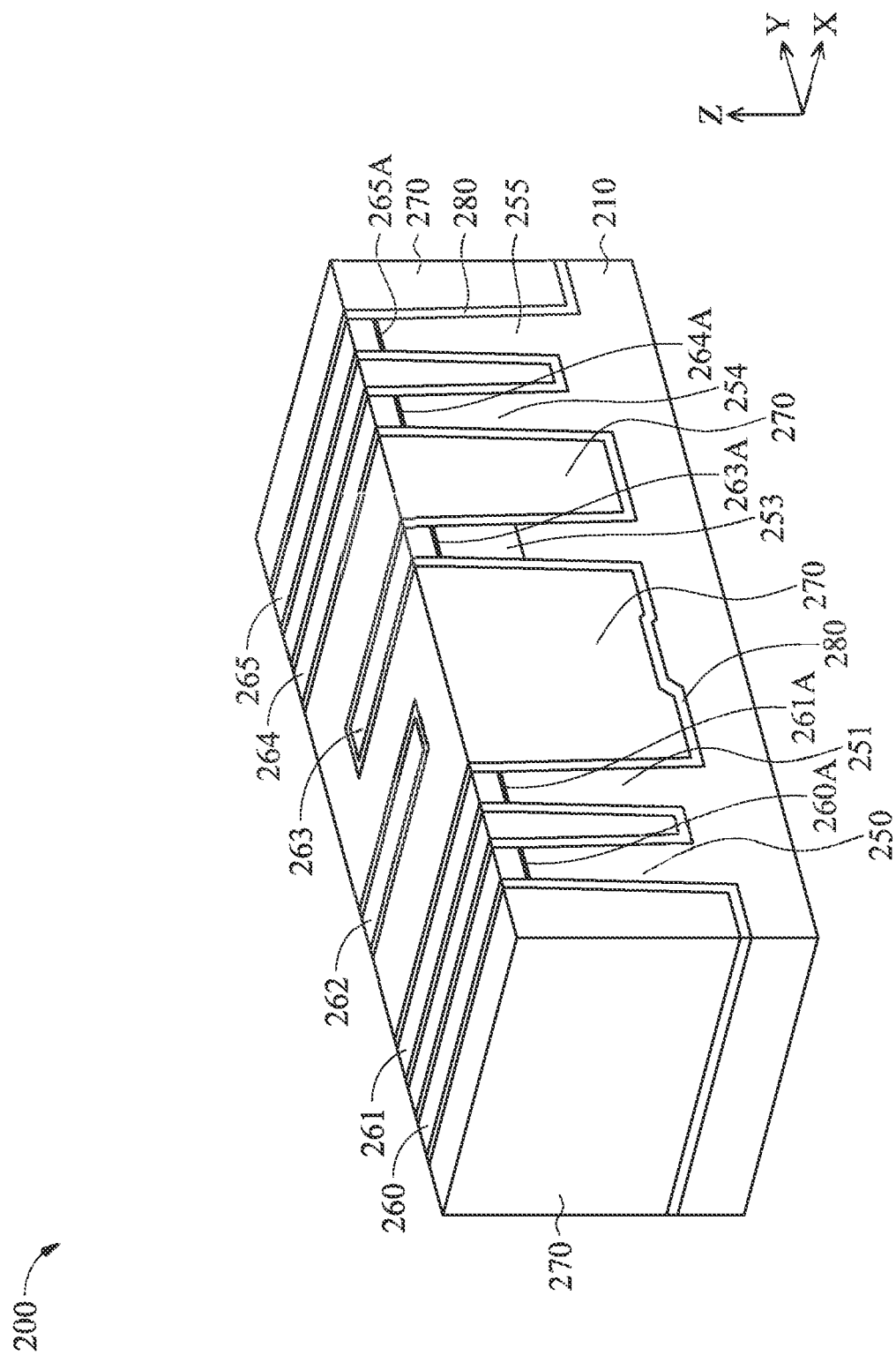
FIGS. 2-6, 8, 10, 12, and 14 illustrate fragmentary 3-dimensional perspective views of a portion of a FinFET device at various stages of fabrication according to an embodiment of the present disclosure.

Referring now to FIG. 2, a semiconductor device 200 is illustrated. The semiconductor device 200 includes FinFET transistors in the illustrated embodiment and may be referred to as a FinFET device interchangeably hereinafter. The semiconductor device 200 includes a substrate 210. The substrate 210 may be implemented as an embodiment of the substrate 102 discussed above with reference to FIG. 1. In some embodiments, the substrate 210 includes a semiconductive material such as a crystal silicon material. An ION implantation process may be performed to implant a plurality of dopant ions to the substrate 210. The dopant ions may include an n-type material for NMOS devices (NFETs), for example arsenic (As) or phosphorous (P), or the dopant ions may include a p-type material for PMOS devices (PFETs), for example boron (B). After the implantation process is performed, a doping concentration level in the substrate 210 may be in a range from about $1 \times 10^{17}$ ions/cm$^3$ to about $5 \times 10^{19}$ ions/cm$^3$.

The semiconductor device 200 includes a plurality of fin structures, such as fin structures 250-255 (note that the fin structure 252 is not directly visible in FIG. 2 but will be shown in later Figures). The fin structures 250-255 may be implemented as an embodiment of the fin structures 104 discussed above with reference to FIG. 1. The fin structures 250-255 protrude vertically upwards out of the substrate 210 in the Z-direction. The fin structures 250-255 also each extend in an elongated manner in the X-direction and are separated from one another in the Y-direction. In the illustrated embodiment, the fin structures 250-251 and 254-255 are fin structures for NFETs and include silicon (Si), whereas the fin structures 252-253 are fin structures for PFETs and include silicon germanium (SiGe). Note that the SiGe fin structures 252-253 are disposed over portions of the substrate 210 (e.g., containing Si) that also protrude upwards. It can be seen in FIG. 2 that the fin structures 252-253 are "recessed" (or not "justified") from the fin structures 260-261 and 264-265. In other words, the fin structures 252-253 have shorter dimensions in the X-direction than the fin structures 260-261 and 264-265 in FIG. 2. However, this is merely due to the semiconductor device 200 being a part of a static random access memory (SRAM). Stated differently, it is common for SRAM layout/design to have PFET fins that are recessed from the NFET fins. However, this is not intended to be limiting. In other embodiments or different circuit applications, the PFET fins and the NFET fins may be "justified" or "edge-aligned", rather than being recessed from one another.

The fin structures 250-255 may be defined by mask layers 260-265. In some embodiments, the mask layers 260-265 include a dielectric material such as silicon nitride. In some embodiments, the mask layers 260-265 may each include two dielectric layers (e.g., a layer of silicon nitride and a layer of silicon oxide). For example, in the embodiment shown in FIG. 2, the mask layers 260-265 include sub-layers 260A-265A, respectively, where the sub-layers 260A-265A contain silicon oxide, while the rest of the mask layers 260-265 (located over the sub-layers 260A-265A) contain silicon nitride. The mask layers 260-265 may be formed by patterning a dielectric material with a patterned photoresist layer. The mask layers 260-265 are then used to pattern a semiconductor material (e.g., Si or SiGe) below to define the fin structures 250-255.

Still referring to FIG. 2, isolation structures 270 are formed to electrically isolate the fins 250-255. The isolation structures 270 may also be referred to as shallow trench isolation (STI) structures. In some embodiments, the isolation structures 270 contain a dielectric material such as silicon oxide. Other suitable dielectric materials are envisioned in other embodiments, as long as the isolation structures 270 have a different material composition than the mask layers 260-265. For example, when the mask layers 260-265 contain silicon nitride, the isolation structures 270 may contain silicon oxide, so that there may be etching selectivity between the mask layers 260-265 and the isolation structures 270. The isolation structures 270 may be formed by depositing the dielectric material to fill the openings that are formed as a result of the fin structures 255-255 being patterned by the hard mask layers 260-265, and then performing a polishing process (such as chemical mechanical polishing) to planarize the surface of the dielectric material.

A liner layer 280 may also be formed between on the fin structures 250-255. The liner layer 280 may include a dielectric material, such as silicon nitride. The liner layer 280 is formed before the isolation structures 270, and thus the liner layer 280 may be located between the fin structures 250-255 and the isolation structures 270.

Figure 3:
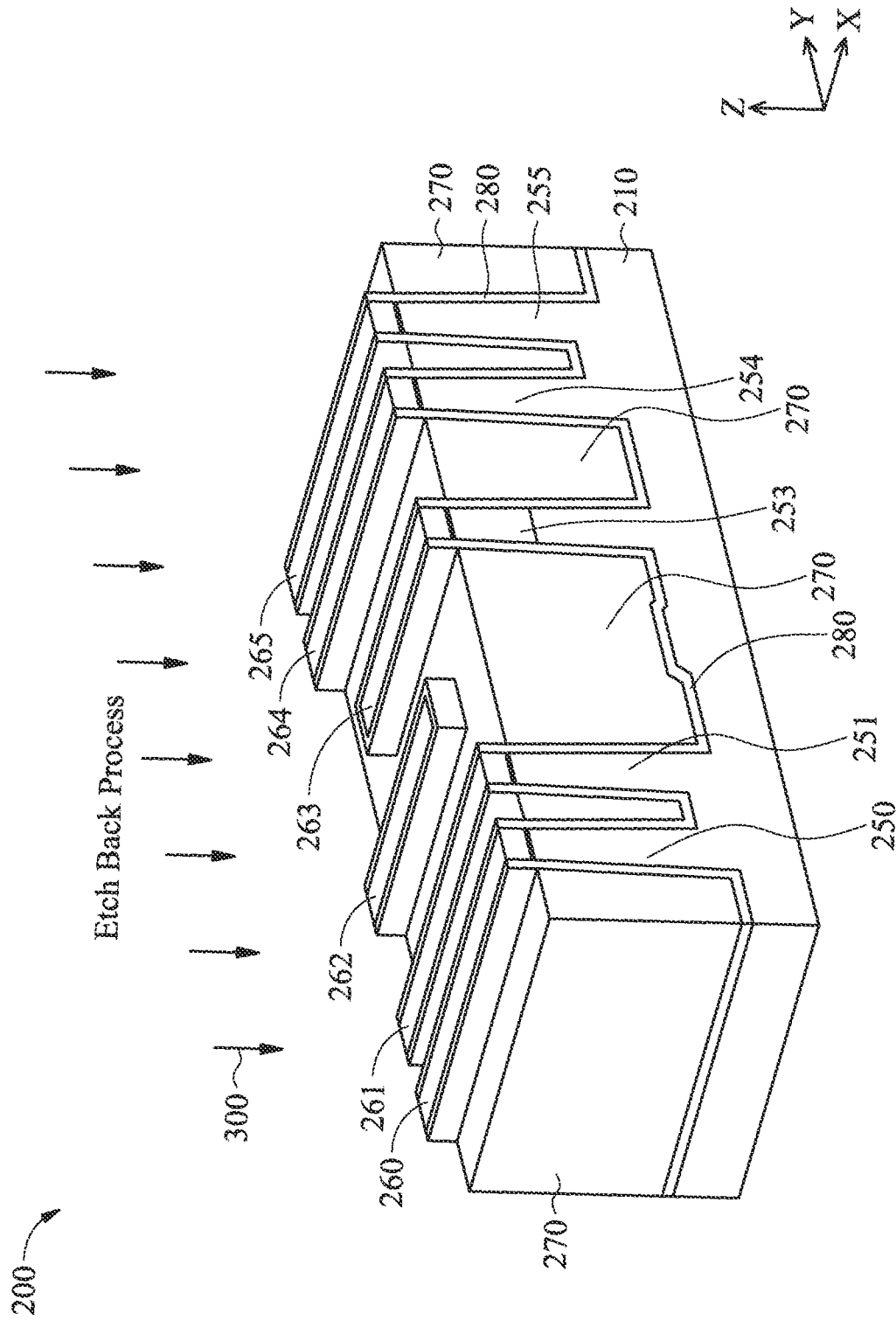

Referring now to FIG. 3, an etch-back process 300 is performed to the semiconductor device 200 to etch away a portion of the isolation structures 270. For example, an upper portion of the isolation structures 270 is etched away, so that the sidewalls of the mask layers 260-265 are exposed. Due to the etching selectivity between the isolation structures 270 and the mask layers 260-265, the portions of the isolation structures 270 may be removed without substantially affecting the mask layers 260-265.

Figure 4:
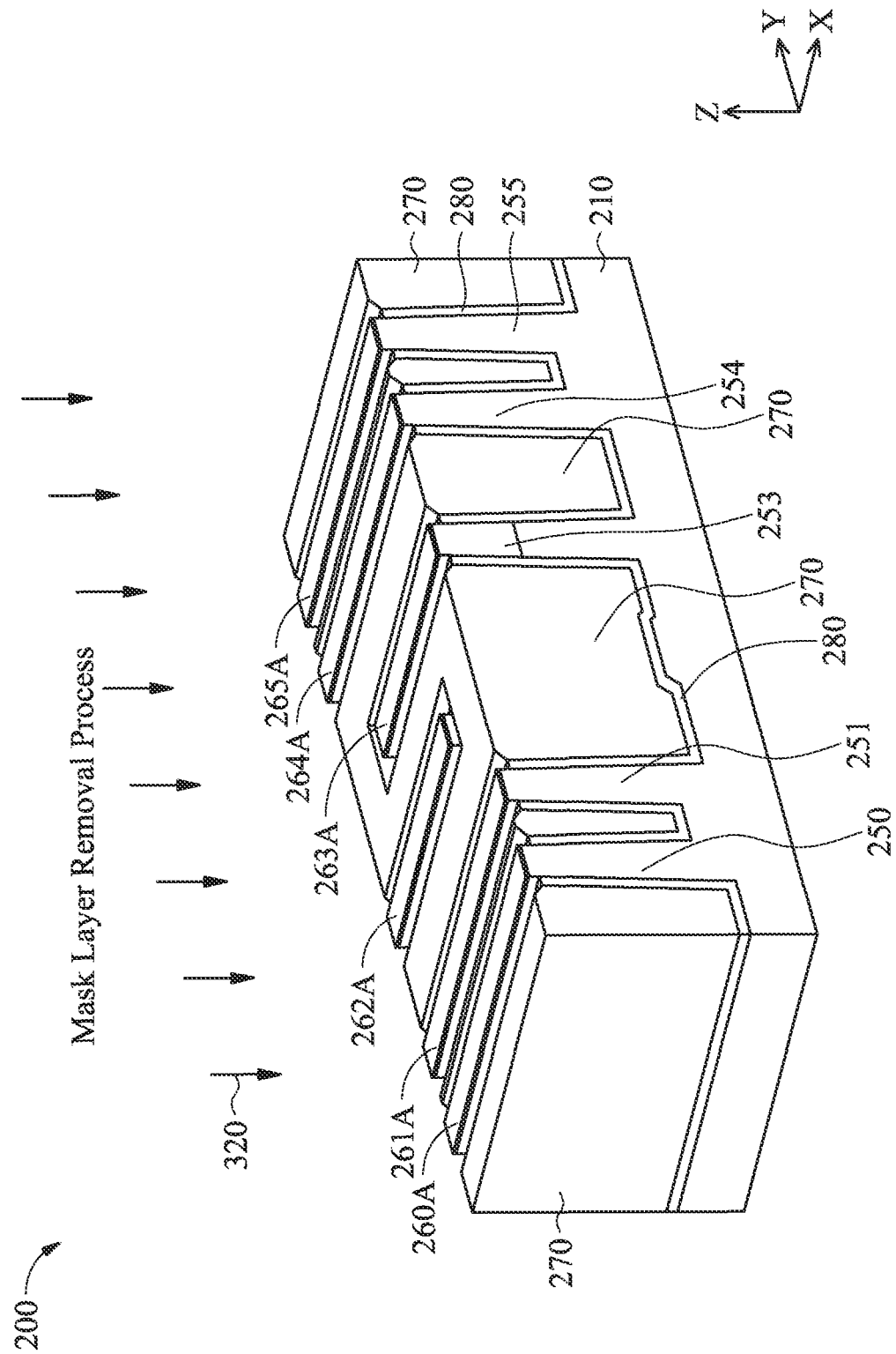

Referring now to FIG. 4, a mask layer removal process 320 may be performed to the semiconductor device 200 to remove the mask layers 260-265. In some embodiments, the mask layer removal process 320 may include an etching process. Again, due to the etching selectivity between the isolation structures 270 and the mask layers 260-265, the mask layers 260-265 may be removed without substantially affecting the isolation structures 270, or the fin structures 250-255 underneath the mask layers 260-265. In embodiments (such as the illustrated embodiment) where the mask layers 260-265 include the sub-layers 260A-265A, the mask layer removal process 320 may remove the main portion of the mask layers 260-265 (e.g., containing silicon nitride) but may not remove the sub-layers 260A-265A (e.g., containing silicon oxide). These sub-layers 260A-265A may be removed in another etching process performed after the process 320, which is not specifically illustrated herein for reasons of simplicity.

Figure 5:
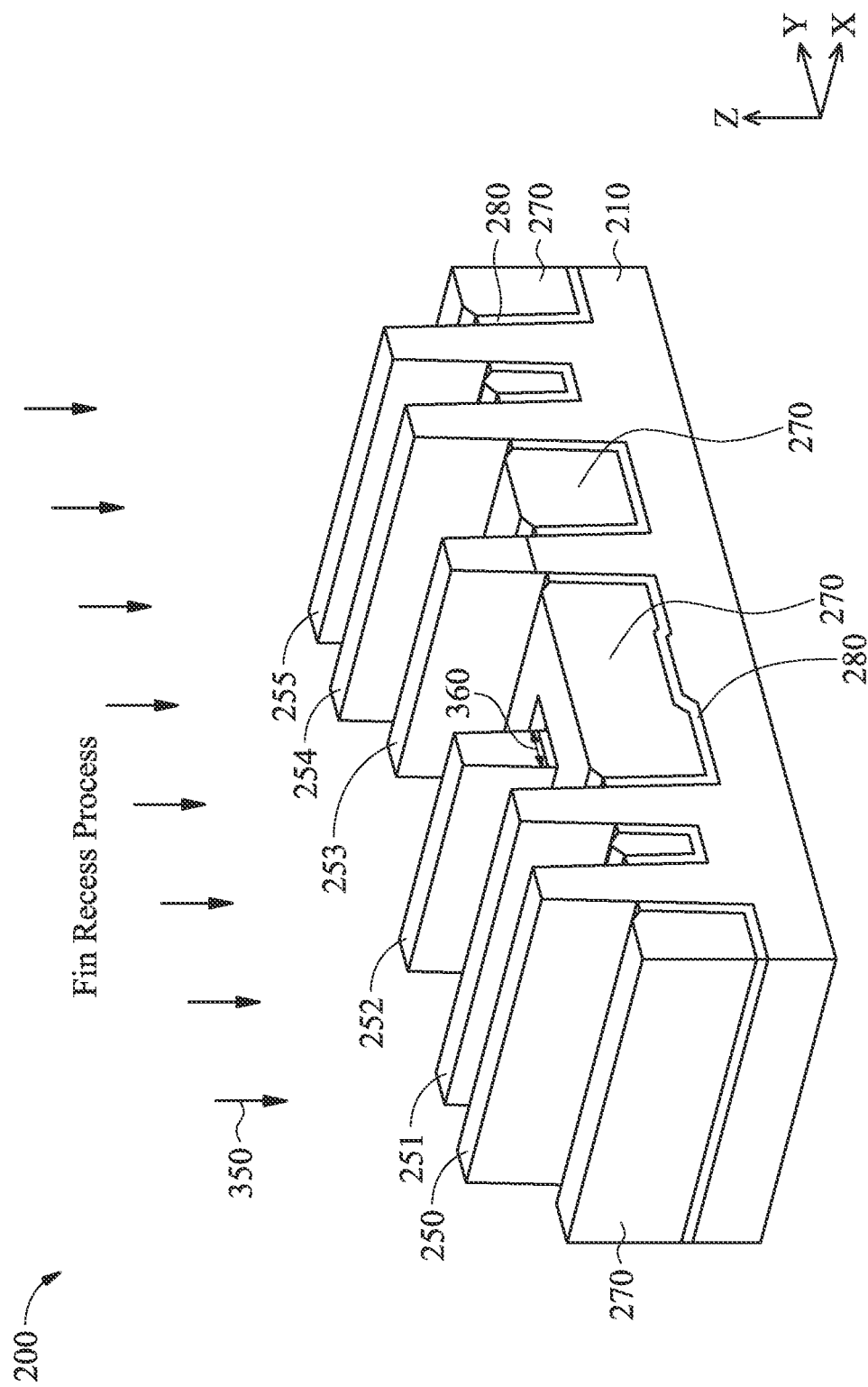

Referring now to FIG. 5, after the mask layers 260-265 (including the sub-layers 260A-265A) are completely removed, a fin recess process 350 is performed to the semiconductor device 200 to etch away portions of the isolation structures 270, thereby forming recesses that are collectively defined by the fin structures 250-255 (e.g., defining the sidewalls of the recesses) and the isolation structures 270 (e.g., defining the bottom of the recess). In some embodiments, the fin recess process 350 includes an etching process, for example a dry etching process. In such an etching process, an etching selectivity exists between the fin structures 250-255 and the isolation structures 270. As such, the isolation structures 270 may be etched away without substantially affecting the fin structures 250-255. As a result of the fin recess process 350, an upper segment of each of the fins structures 250-255 becomes exposed (e.g., their sidewall surfaces are not covered by the isolation structures 270). At this stage of fabrication, the fin structures 250-255 may have a lateral dimension 360 measured in the Y-direction. The lateral dimension 360 may still be greater than what is desired, and thus it will be reduced in a trimming process discussed below.

Figure 6:
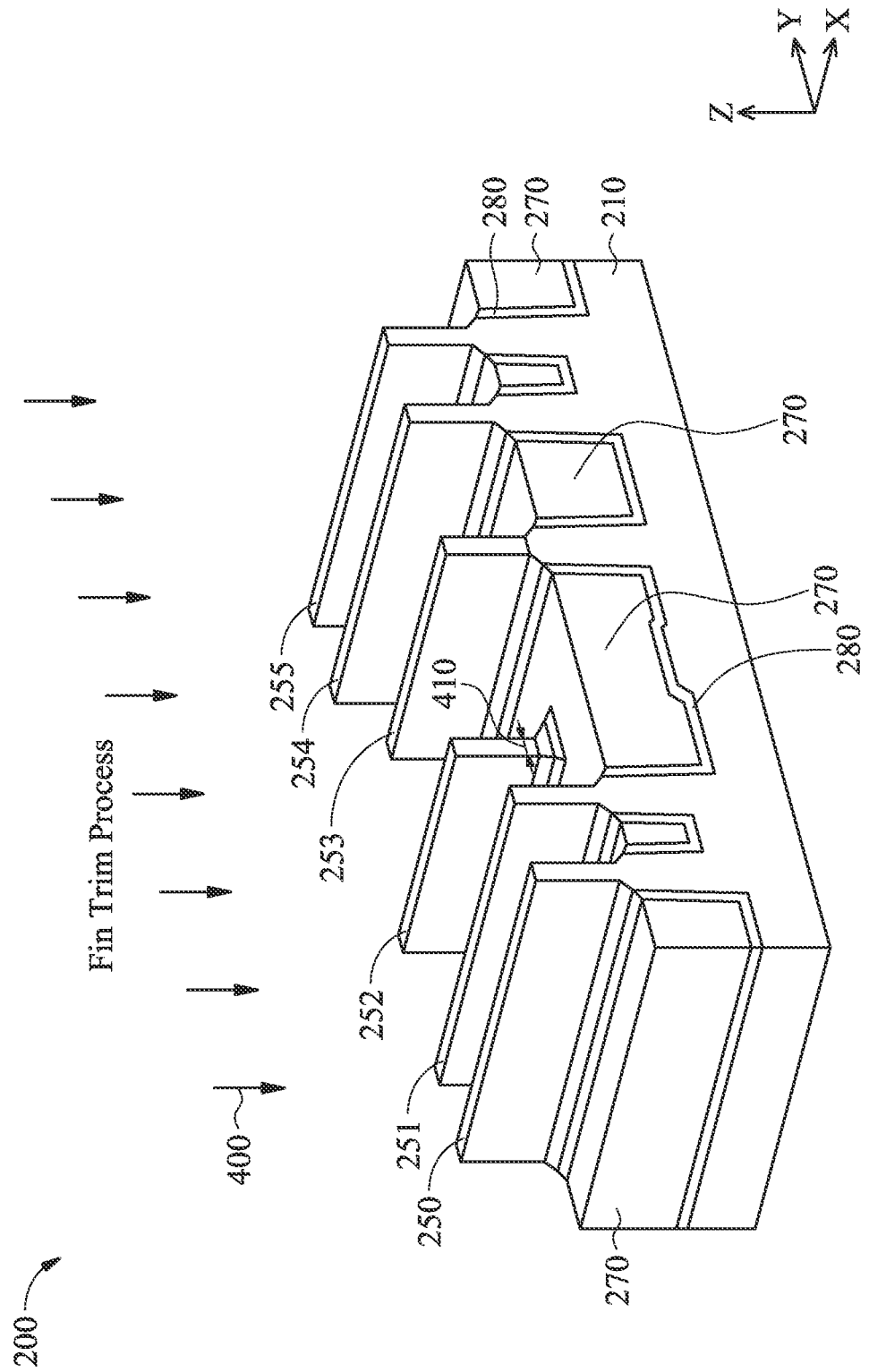
Figure 7:
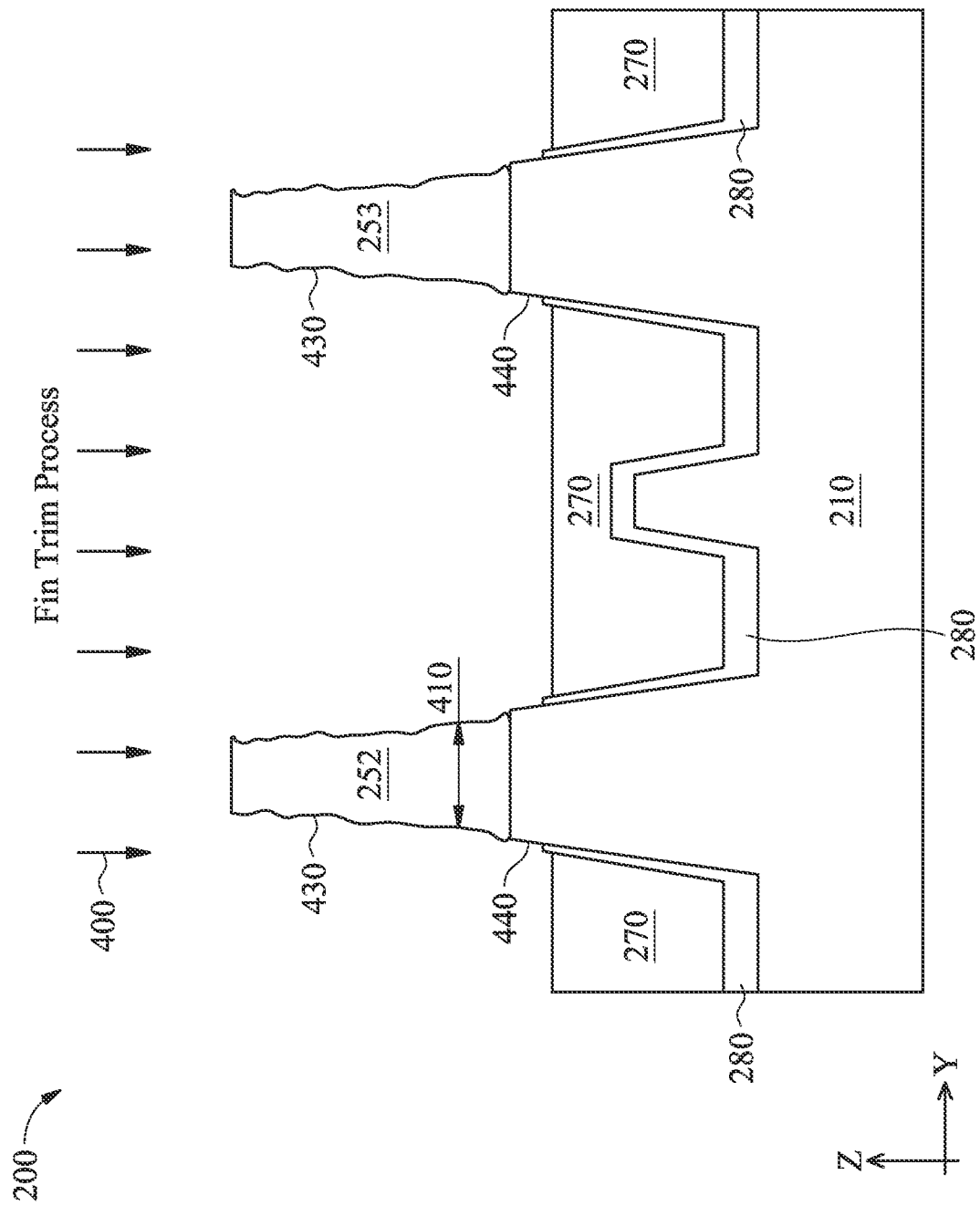
FIGS. 7, 9, 11, and 13 illustrate fragmentary cross-sectional side views of a portion of a FinFET device at various stages of fabrication according to an embodiment of the present disclosure.

Referring now to FIGS. 6-7 (where FIG. 7 illustrates a cross-sectional view of the fin structures 252-253 (SiGe fins for the PFETs)), a fin trim process 400 is performed to the semiconductor device 200 to reduce a lateral dimension of each of the fin structures 250-255, for example the lateral dimension measured in the Y-direction. In some embodiments, the fin trim process 400 is performed in a first semiconductor fabrication tool having a first chamber, for example a semiconductor fabrication tool that includes a wet cleaning chamber or a dry etching chamber. The fin trim process 400 effectively shrinks a critical dimension (CD) of the FinFET devices herein, since the CD is associated with the lateral dimension of the fin structures 250-255.

In some embodiments, the fin trim process 400 includes an oxidation process in which the surface portions of the fin structures 250-255 are oxidized, followed by applying a hydrofluoric (HF) acid to the fin structures 250-255 to remove the oxidized portions thereof. As a result of the fin trim process 400, the "trimmed" fin structures 250-255 now have a smaller lateral dimension 410 in the Y-direction. In other words, the lateral dimension 410 is smaller than the lateral dimension 360 shown in FIG. 5. In some embodiments, the lateral dimension 410 is in a range from about 5 nanometers (nm) to about 12 nm.

As shown in FIG. 7, the fin recess process 350 and the fin trim process 400 are performed to completely expose the sidewall surfaces of the fin structures, such as the surfaces 430 of the fin structures 252-253. In some embodiments, in order to ensure there is sufficient margin to expose the surfaces 430 of the fin structures 252-253, sidewall surfaces 440 of a portion of the semiconductor layer (e.g., protruding portions of the substrate 210) underneath the fin structures 252-253 may also become exposed. In addition, the side surfaces of a small portion of the liner layer 280 may become exposed as well.

One downside of the fin trim process 400 is that it may roughen the surfaces of the fin structures 250-255. This is shown in more detail in the cross-sectional view of FIG. 7, where it can be seen that the exposed surfaces 430 of the fin structures 252-253 are rough. For example, the surfaces 430 may exhibit a significant amount of topography variation, such as protrusions and dips, and are therefore not as flat or smooth as they are desired to be. It is understood that the fin trim process 400 is not necessarily the sole culprit for the surface roughness of the fin structures. Other processes discussed above such as the processes for defining the shape of the fin structures 250-255 (e.g., using the mask layers 260-265), or even the fin recess process 350 (discussed above with reference to FIG. 5), may also contribute to the surface roughness of the fin structures 250-255. Excessive surface roughness of the fin structures 250-255 may be undesirable, as it may result in a high resistivity and/or low carrier mobility, since it may more difficult for carriers such as electrons or holes to move in or through rough surfaces.

In some embodiments, the surface roughness of the surfaces 430 may be represented by a line width roughness (LWR), or by a line edge roughness (LER). It may be said that at this stage of fabrication, the fin structures (such as the fin structures 252-253) have a first surface roughness, for example a LWR in a range between about 2.1 nm and about 2.3 nm, or a LER in a range between about 1.8 nm and about 2.0 nm.

Figure 8:
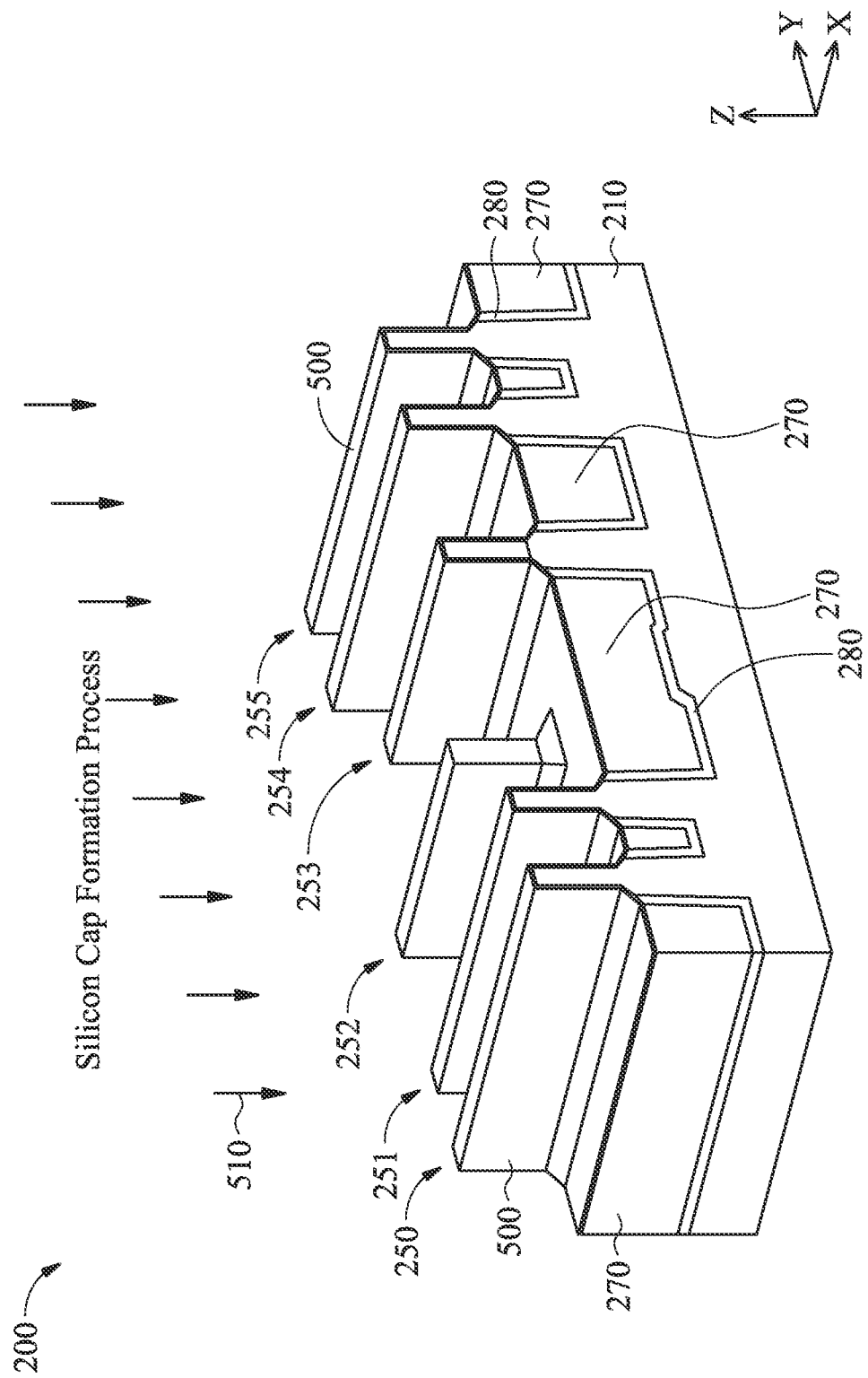
Figure 9:
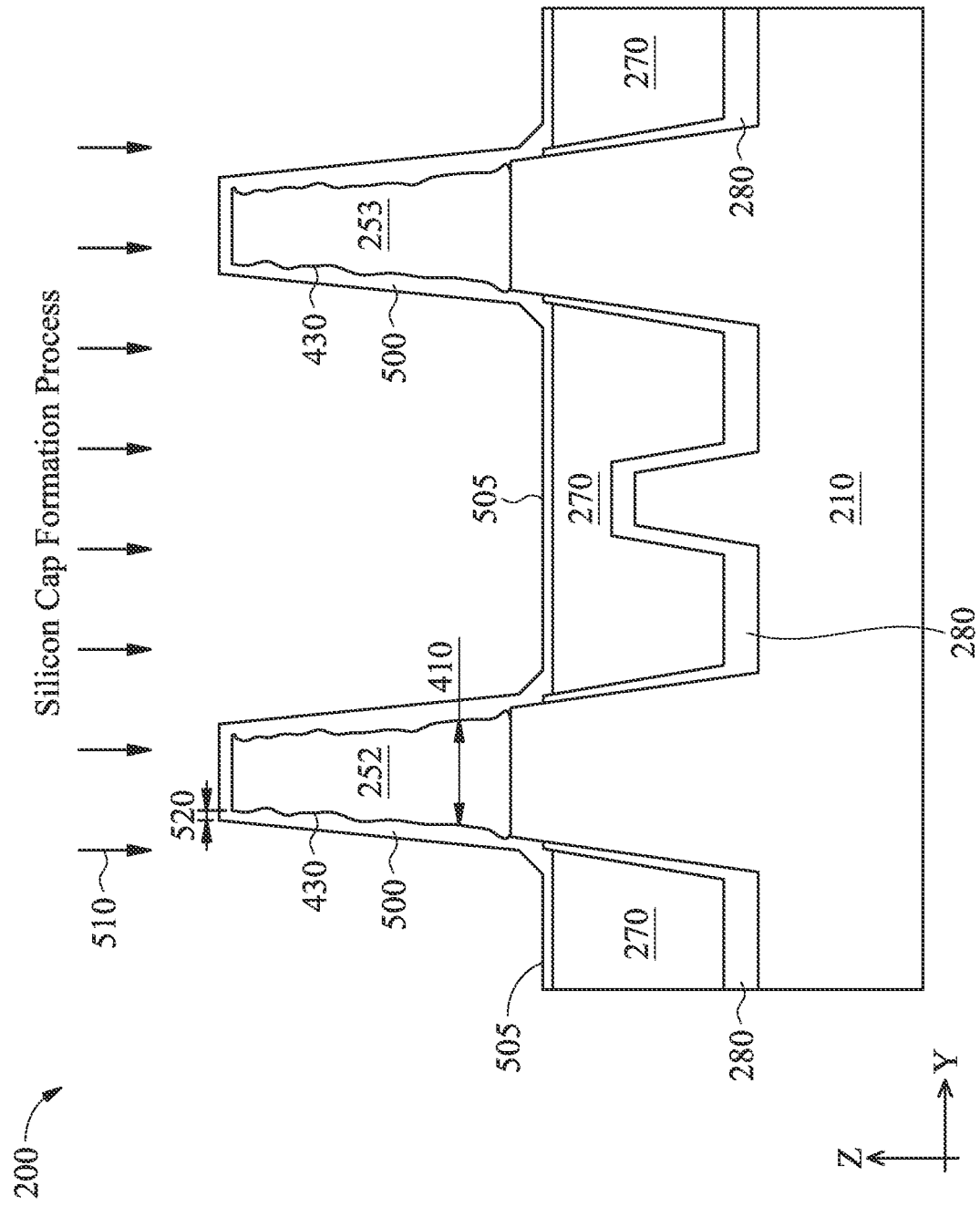

Referring now to FIGS. 8-9, a silicon cap layer 500 is formed on the fin structures 250-255, including the sidewall surfaces of the fin structures. The silicon cap layer 500 is formed using a silicon cap formation process 510. In some embodiments, the silicon cap formation process 510 may include an epitaxial growth process, such that silicon (i.e., the silicon cap layer 500) is grown on the fin structures 252-253. The epitaxial growth process may also cause an amorphous silicon layer 505 to be grown on the upper surface of the isolation structure 270. In some embodiments, the silicon cap formation process 510 is performed in a second semiconductor fabrication tool that includes a second chamber and a third chamber. The second semiconductor tool is different from the first semiconductor fabrication tool in which the fin trim process 400 is performed. As such, the wafer on which the semiconductor device 200 is formed is transferred from the first semiconductor fabrication tool to the second semiconductor fabrication tool. During this transfer process, the wafer may be exposed to ambient air, which contains oxygen that may oxidize surfaces of the wafer (e.g., on both the NFETs and the PFETs). The resulting surface oxide may be removed in the second chamber of the second semiconductor fabrication tool, which may be a dry etching chamber, for example. Thereafter, the wafer is transferred internally within the second semiconductor fabrication tool from the second chamber to the third chamber, which may be a chamber for performing epitaxial growth. The internal transfer from the second chamber to the third chamber is performed under a vacuum (or substantially oxygen-free) environment, which prevents surface oxides from being formed on the wafer again.

One reason for forming a silicon cap layer 500 on the SiGe fin structures 252-253 is that SiGe is not a desirable candidate for oxides. That is, an oxidation process will need to be performed later (discussed below with reference to FIGS. 12-13) to form a dielectric layer on the fin structures. In some embodiments, such a dielectric layer may serve as an interfacial layer for a PFET transistor. For optimal device performance, silicon oxide is a more desirable candidate than germanium oxide for this dielectric layer. As such, it would be undesirable to oxidize the SiGe material of the fin structures 252-253 directly. Instead, it would be better to oxidize a silicon material, for example the silicon material of the silicon cap layer 500. This is one reason for forming the silicon cap layer 500 over the fin structures 252-253.

It is also understood that while it is not necessary to form this silicon cap layer 500 over the fin structures 250-251 and 254-255 of the NFETs—since the fin structures 250-251 and 254-255 already are made of silicon—the silicon cap layer 500 may still be formed on the fin structures 250-251 and 254-255 in the illustrated embodiment. This is because it may have been more complicated and more expensive to not form the silicon cap layer for the NFETs, which may involve forming a protective layer over the fin structures 250-251 and 254-255 for the sole purpose of preventing the formation of the silicon cap layer 500 thereon, and then removing such a protective layer later after the silicon layer 500 has been formed over the fin structures 252-253 for the PFETs. Nevertheless, it is understood that in some embodiments, the silicon cap layer 500 may be formed on the fin structures 252-253 but not on the fin structures 250-251 and 254-255.

At this stage of fabrication shown in FIG. 9, the silicon cap layer 500 is formed to have a thickness 520. In some embodiments, the thickness 520 is in a range between about 5 angstroms and about 11 angstroms, with a median value of about 8 angstroms. This range of the thickness 520 may not be optimal for the subsequent I/O oxide formation, as it may be too thin. If the thickness 520 is too thin, it may mean that the subsequent I/O oxide formation will consume (e.g., oxidize) not only all of the silicon cap layer 500, but also a portion of the SiGe material of the fin structures 252-253. As discussed above, germanium oxide is not an ideal material for the interfacial layer. Thus, it is desirable to have a silicon cap layer 500 that is sufficiently thick, so that the subsequent oxidation process will not "eat into" the SiGe material of the fin structures 252-253. While conventional FinFET fabrication methods have not sufficiently addressed this issue, the present disclosure will thicken the silicon cap layer via an annealing process, as discussed in more detail below.

Figure 10:
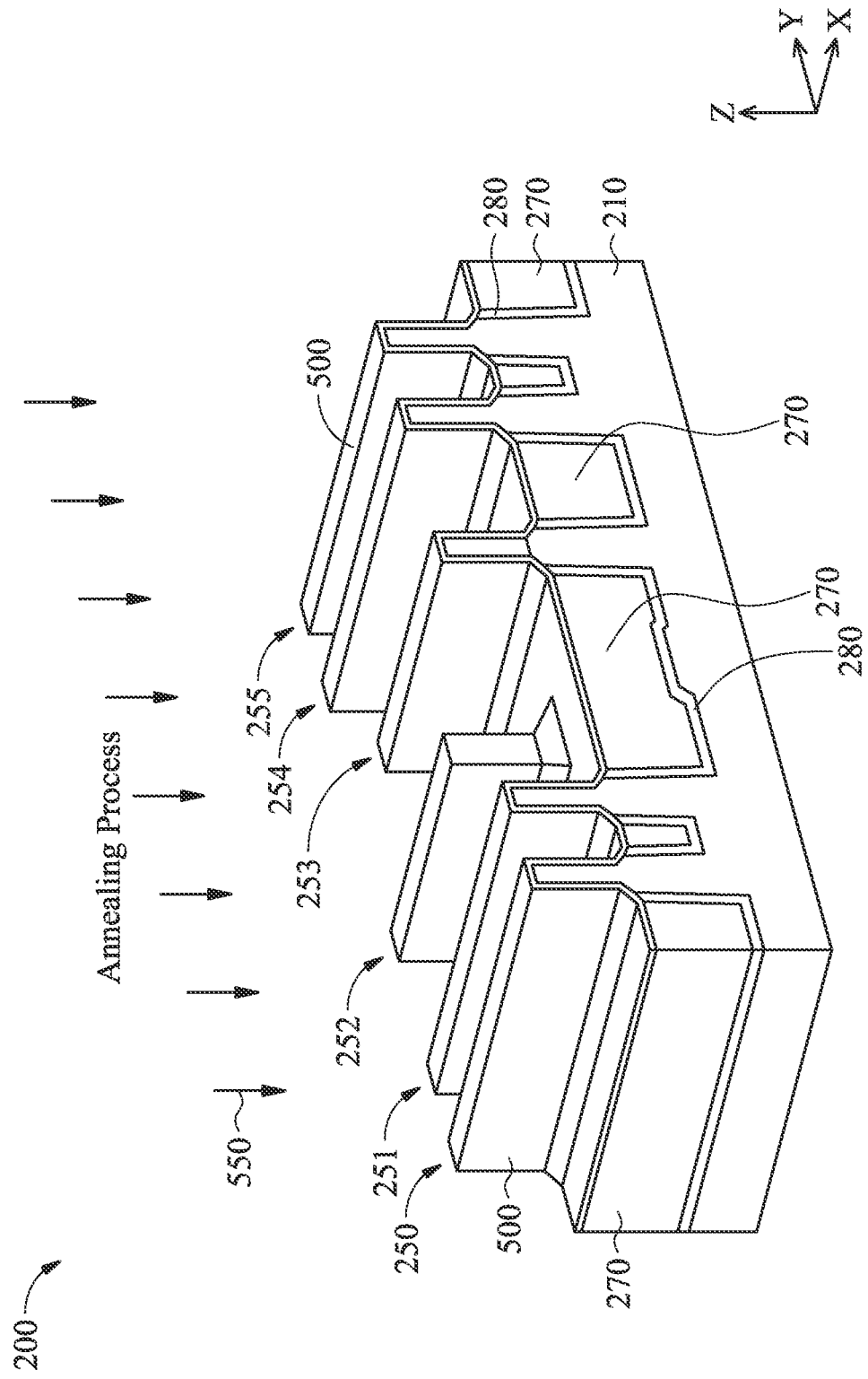
Figure 11:
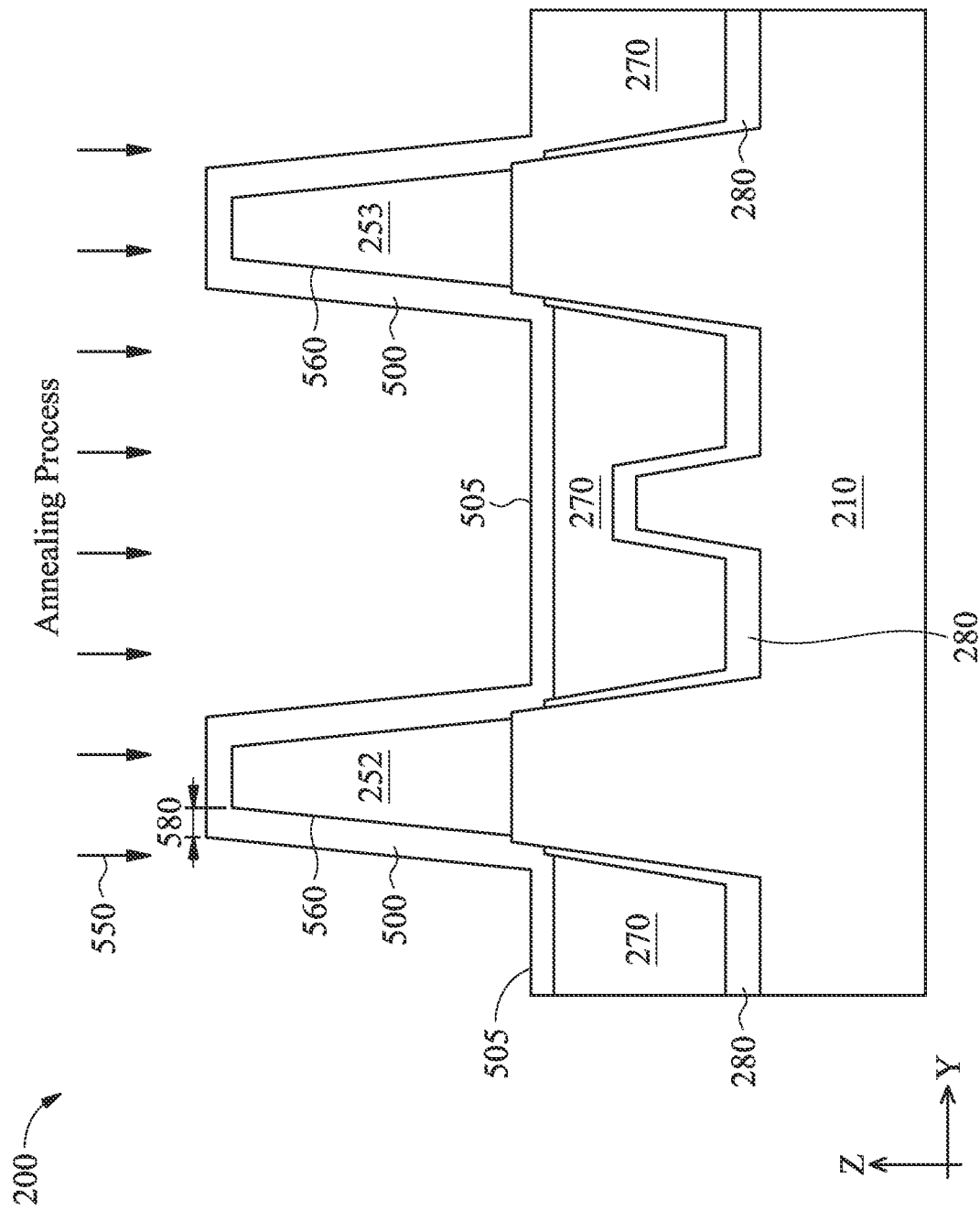

Referring now to FIGS. 10-11, an annealing process 550 is performed to the semiconductor device 200. In some embodiments, the annealing process 550 includes a spike annealing process. The spike annealing process may be performed using the following process parameters or conditions: a peak annealing temperature that is maintained to be in a range between about 800 degrees Celsius and about 900 degrees Celsius, an annealing time (or duration) (during which the peak temperature is maintained) that is in a range between about 1 second and about 10 seconds, and an annealing pressure that is in a range between about 50 torrs and about 760 torrs. In other embodiments, the annealing process 550 includes a soak annealing process. The soak annealing process may be performed using the following process parameters or conditions: a peak annealing temperature that is maintained to be in a range between about 300 degrees Celsius and about 450 degrees Celsius, an annealing time (or duration) (during which the peak temperature is maintained) that is in a range between about 50 seconds and about 200 seconds, and an annealing pressure that is in a range between about 50 torrs and about 760 torrs. In some embodiments, the annealing process 550 may include a combination of a spike annealing process and a soak annealing process. In some embodiments, an inert gas (e.g., $N_2$) is used for the spike annealing process and/or the soak annealing process. In some embodiments, a flow rate of the inert gas in the spike annealing process and/or the soak annealing process is in a range between about 5 standard liters per minute (SLM) and about 45 SLM.

These process parameters above of the annealing process 550 are not arbitrarily chosen but rather are carefully tuned to improve the quality of the fin structures 252 and 253. In that regard, the annealing process 550 is tuned to repair the fin structures 252-253 and reduce the surface roughness of the fin structures 252 and 253, to increase a purity of the silicon cap layer 500, and to thickens the silicon cap layer 500.

For example, the annealing process 550 provides enough energy to allow the atoms on the surface of the fin structures 252-253 to rearrange themselves to have a more crystal-like quality (e.g., smooth and orderly). The result is smoother fin surfaces 560. In other words, the fin surfaces 560 are smoother or have less roughness than the fin surfaces 430. In some embodiments, the surface roughness of the surfaces 560 may also be represented by a line width roughness (LWR), or by a line edge roughness (LER).

Figure 16:
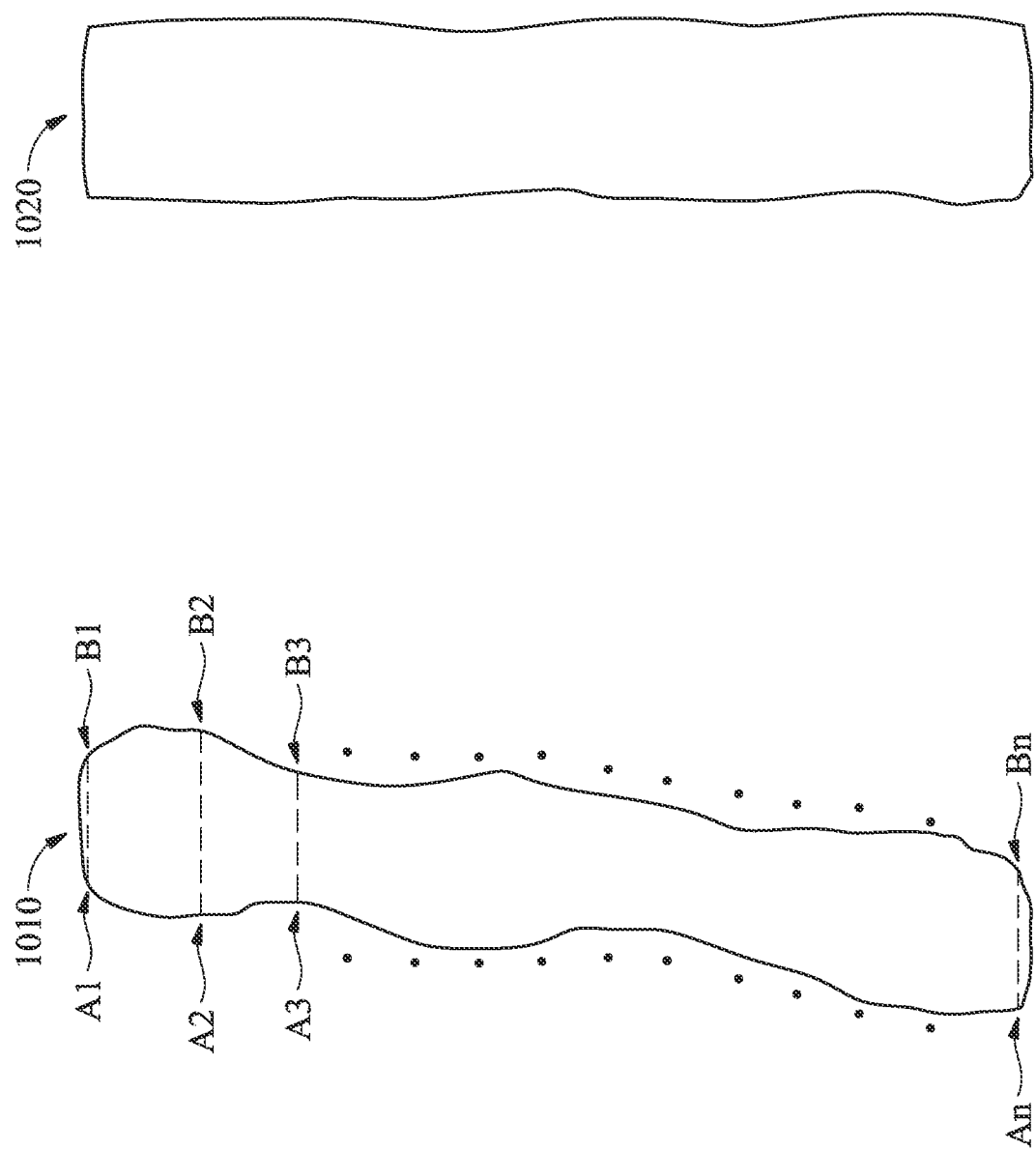
FIG. 16 illustrates top views of a fin structure fabricated according to conventional methods and a fin structure fabricated according to an embodiment of the present disclosure.

LWR and LER are discussed in more detail with reference to FIG. 16. In more detail, FIG. 16 illustrates top views of a fin structure 1010 and a fin structure 1020. The fin structure 1010 may represent a fin structure that is a result of being fabricated according to conventional processes, whereas the fin structure 1020 may represent the fin structure fabricated according to the present disclosure, for example the fin structures 252-253. In some embodiments, LWR and LER are measured as follows: a plurality of (e.g., n) points are taken on opposite sides of the fin structure. For example, a plurality of points A1-An are taken on the "left" boundary of the fin structure 1010, and a plurality of points B1-Bn are taken on the "right" boundary of the in structure. These points A1-An and B1-Bn may be obtained by a scanning electron microscope (SEM) image, for example. The horizontal distance between each set of points A1-B1 through An-Bn measures the "width" or critical dimension (CD) of the fin structure at a different segment. For example, the distance between A1-B1 measures the width or CD of the fin structure 1010 at a top end portion of the fin structure 1010, the distance between An-Bn measures the width or CD of the fin structure 1010 at a bottom end portion of the fin structure 1010, and the distances between the rest of the point sets between A1 and An and B1 and Bn measure the widths or CDs of the fin structure 1010 at various segments between the top end and the bottom end. When all these distances are measured, a variation among them—for example a three sigma (where sigma is a standard deviation) value—may be used to define the LWR. The LWR measures how uniform the width or CD of the fin structure 1010 is throughout the fin structure 1010. As such, a high LWR value may indicate a fin structure that has some portions that are significantly wider than other portions.

The definition of LER is still based on the points A1-An and B1-Bn, but LER is defined differently from LWR. In some embodiments, LER is defined as follows: a horizontal distance is measured between a fixed point on one side (e.g., A1) and the rest of the points on the opposite side (e.g., B1-Bn). Note that the horizontal distance is not the same as the diagonal distance. For example, the horizontal distance between A1 and B2 is not the diagonal distance that would connect A1 to B2. Rather, the horizontal distance would be a distance between B2 and a point corresponding to A1's horizontal position (e.g., as if A1 is shifted downwards until it is horizontally aligned with B2). In any case, once the horizontal distances between the fixed point and all the points on the opposite side are obtained, a variation among them (e.g., a three sigma value) may be used to define the LER. The LER measures how "straight" or "linear" the fin structure 1010 is overall. As such, a high LER value may indicate a fin structure that may be too "wiggly" or "wavy".

The LWR and LER are defined the same way for the fin structure 1020, but the points A1-An and B1-Bn are not specifically shown for the fin structure 1020 for ease of illustration. It can be seen based on FIG. 16 that the fin structure 1010 (not fabricated according to the present disclosure) has significantly greater variations in its width compared to the fin structure 1020, and as such it has a greater LWR. Furthermore, the fin structure 1010 is more "wiggly" than the fin structure 1020, which indicates that the fin structure 1010 has a greater LER than the fin structure 1020.

Thus, it may be said that at the stage of fabrication after the performance of the annealing process 550, the fin structures (such as the fin structures 252-253) have a second surface roughness that is less than the first surface roughness associated with the surfaces 430, for example a LWR in a range between about 1.7 nm and about 1.9 nm, or a LER in a range between about 1.5 nm and about 1.7 nm. It is understood that the reduced surface roughness of the fin structures 252-253 fabricated according to the present disclosure may also be represented by a ratio of the LWR versus the average fin width, or a ratio of the LER versus the average fin width. For example, with the average fin width of the fin structure 252 or 253 being represented by Fin_width_average, a ratio of LWR:Fin_width_average is in a range between about 1:4 and about 1:5, and a ratio of LER:Fin_width_average is also in a range between about 1:4 and about 1:5. In comparison, fin structures not fabricated according to the present disclosure typically has much ratios of LWR:Fin_width_average or LER:Fin_width_average that are much greater than 1:4 or 1:5 (e.g., a ratio of 1:3 or 1:2). The annealing process 550 also reduces the presence of germanium oxide in the fin structures 252-253. In that regard, after the formation of the fin structures 252-253, native oxides in the form of germanium oxide ($GeO_x$) may be naturally formed on the fin structures 252-253. After the formation of the silicon cap layer 500, the germanium oxide material may be located at an interface between the fin structures 252-253 and the silicon cap layer 500. The presence of the germanium oxide material herein lowers a purity of the silicon cap layer and/or the purity of the SiGe material of the fin structures and may have a negative impact with respect to density of interface trap (DIT).

The annealing process 550—with the specifically tuned process parameters discussed above-provides an energy boost to help break the bonds between germanium and oxygen in germanium oxides. Germanium and oxygen may be diffused outwards. In this diffusion process, the oxygen component may oxidize the silicon atoms of the silicon cap layer 500 to form silicon oxide at an outer surface of the silicon cap layer. The germanium component may escape the semiconductor device 200 in the form of a gaseous product. Again, the process parameters of the annealing process 550 are carefully tuned to facilitate the mechanism discussed above. For example, if the annealing temperature is too high, and/or when the annealing duration is too long, and/or when the annealing pressure is too low, then silicon and germanium may reflow instead of being diffused outwards, and this may undesirably alter the shape of the fin structures 252-253. For example, the fin structures 252-253 may each have a ball-like shape due to the reflow of silicon and/or germanium, rather than the rectangular or trapezoidal shape that is more desirable. On the other hand, if the annealing temperature is too low, and/or when the annealing duration is too short, and/or when the annealing pressure is too high, then the annealing process 550 may not be able to provide enough of an energy boost to facilitate the diffusion of the germanium and oxygen, and the fin structures 252-253 may not be repaired sufficiently.

Here, as a result of the carefully configured annealing process 550 (e.g., with the specific process parameters discussed above to reduce the fin surface roughness and to thicken the silicon cap layer), the fin structures 252-253 may be repaired and may be substantially free of germanium oxide, and the silicon cap layer 500 is also thickened (through the elimination or reduction of the germanium content). For example, the silicon cap layer 500 now has a thickness 580 that is greater than the thickness 520 (corresponding to before the annealing process 550 is performed). In some embodiments, the thickness 580 is in a range between about 7 angstroms and about 15 angstroms, with a median value of about 11 angstroms. Comparing the values of the thickness 580 to the thickness 520 (e.g., between about 5 angstroms and 11 angstroms with a media value of about 8 angstroms) of the silicon cap layer 500 before the annealing process 550, it can be seen that the annealing process 550 thickens the silicon cap layer 500 by at least a few angstroms.

The range of thickness 580 is also specifically configured to optimize the subsequent I/O oxidation process. If the value of the thickness 580 is too low, then as discussed above the subsequent I/O oxidation process may consume all of the silicon cap layer 500 (even though it has been thickened) and could potentially "eat into" the SiGe material of the fin structures 252-253. On the other hand, if the value of the thickness 580 is too high, then the subsequent I/O oxidation process may leave too much of the silicon material of the silicon cap layer 500 un-oxidized. For example, an outer portion of the silicon cap layer 500 may be oxidized into silicon oxide, while an inner portion of the silicon cap layer 500 may remain silicon. When this occurs, the channel (and/or source/drain) material for the PFET becomes a mixture of SiGe and silicon, rather than just SiGe (which is desired for PFETs). As the thickness 580 increases, this problem may become exacerbated (e.g., a greater percentage of the PFET channel and/or source/drain is now made of silicon, rather than pure SiGe). As such, it may be desirable to have the silicon cap layer 500 sufficiently thickened to an extent such that it may be mostly oxidized in the subsequent oxidation process, without risking the underlying SiGe material of the fin structures 252-253 being oxidized. The thickness 580—tuned as a result of the carefully chosen annealing process parameters discussed above—can achieve this goal.

Figure 12:
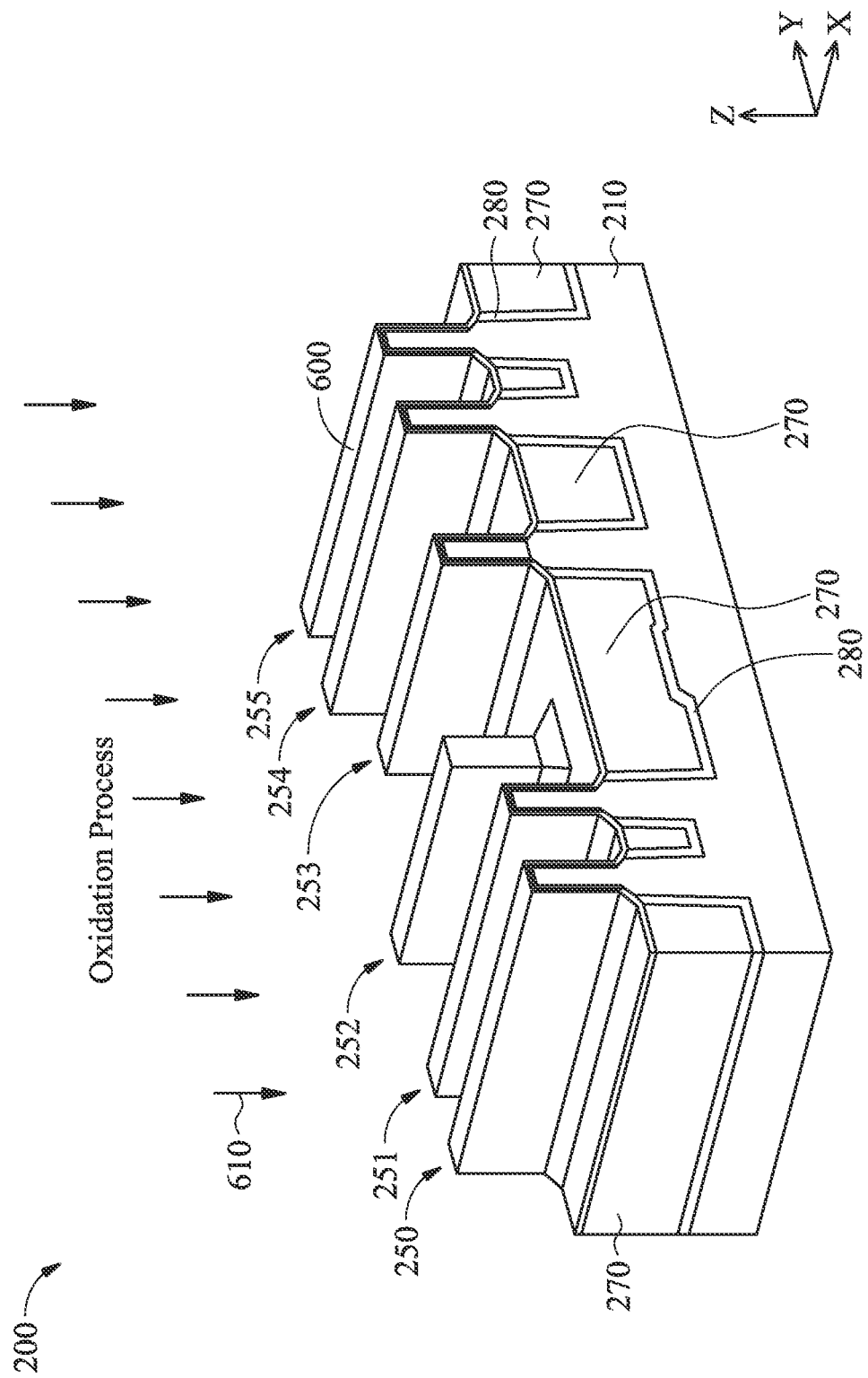
Figure 13:
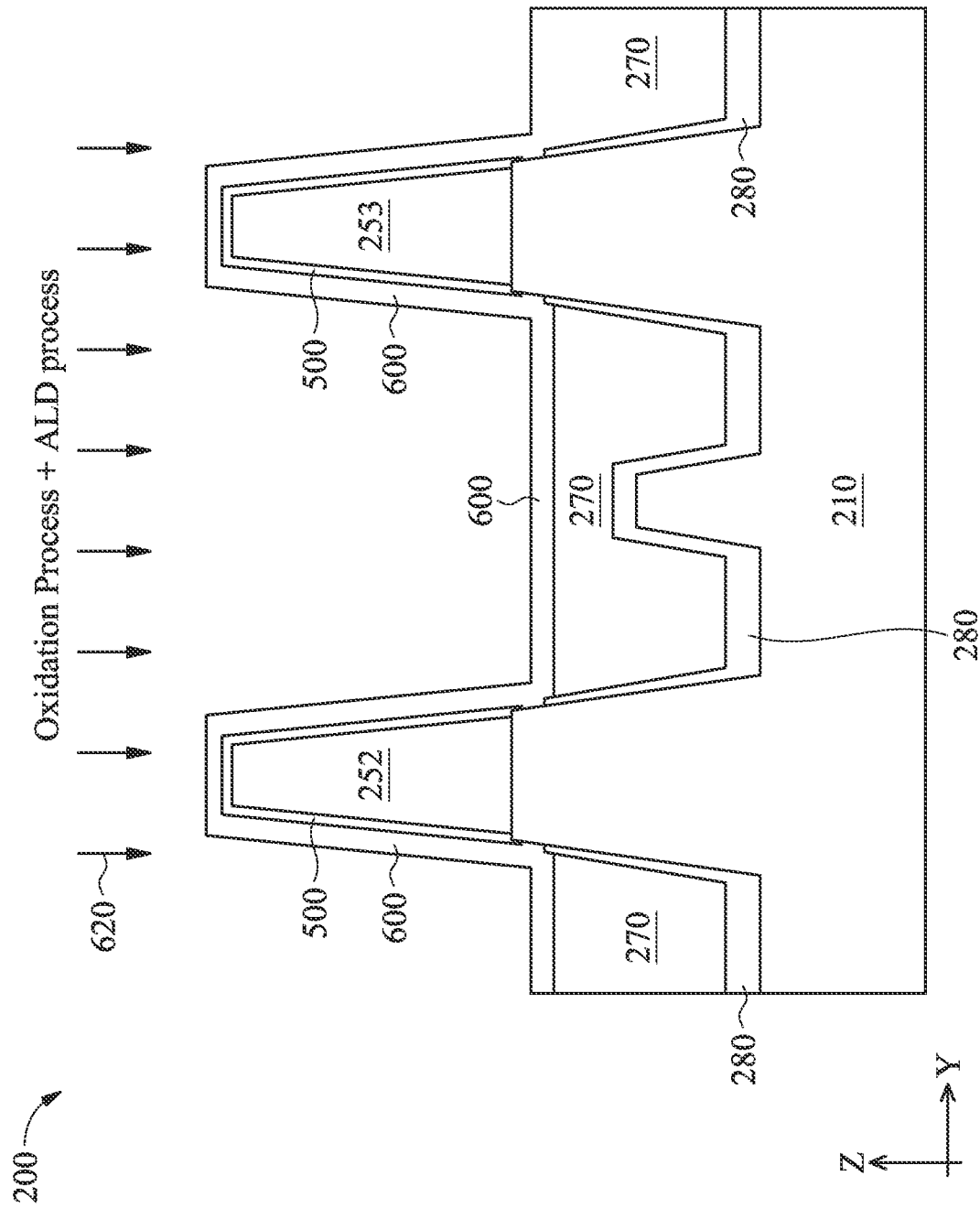

Referring now to FIGS. 12-13, a dielectric layer 600 is formed over the semiconductor device 200. In some embodiments, the dielectric layer 600 is formed using an oxidation process and an ALD process 620. The oxidation process oxidizes a portion of the silicon cap layer 500 and the amorphous silicon layer 505 near their outside surfaces. The oxidized portions form a part of the dielectric layer 600, which may contain silicon oxide. The rest of the dielectric layer 600 is formed by the ALD process. As discussed above, since the annealing process 550 effectively removes germanium oxide from the interface of the silicon cap layer 500 and the fin structures 252-253, the oxidation of the silicon cap layer 500 can form a better quality silicon oxide layer as the dielectric layer 600. The dielectric layer 600 may serve as an interfacial layer in a gate structure for the PFETs and may be interchangeably referred to as an interfacial layer hereinafter. It is understood that in embodiments where the isolation structures 270 contain silicon oxide, the dielectric layer 600 and the isolation structures 270 may have substantially similar (or the same) material compositions. For example, they may both have a silicon oxide composition, though the silicon oxide of the isolation structures 270 may include slightly more impurities than the silicon oxide of the dielectric layer 600.

Also as discussed above, since the annealing process 550 thickens the silicon cap layer 500, the oxidation process 610 can be performed with minimal risk of inadvertently oxidizing the SiGe material of the fin structures 252-253. In the embodiment shown in FIG. 13, a small portion of the silicon cap layer 500 may still remain un-oxidized even after the performance of the oxidation process 610. In some embodiments, a thickness of the remaining portion of the silicon cap layer 500 is in a range between about 3 angstroms and about 11 angstroms. In other embodiments, however, substantially all of the silicon cap layer 500 may be oxidized.

Figure 14:
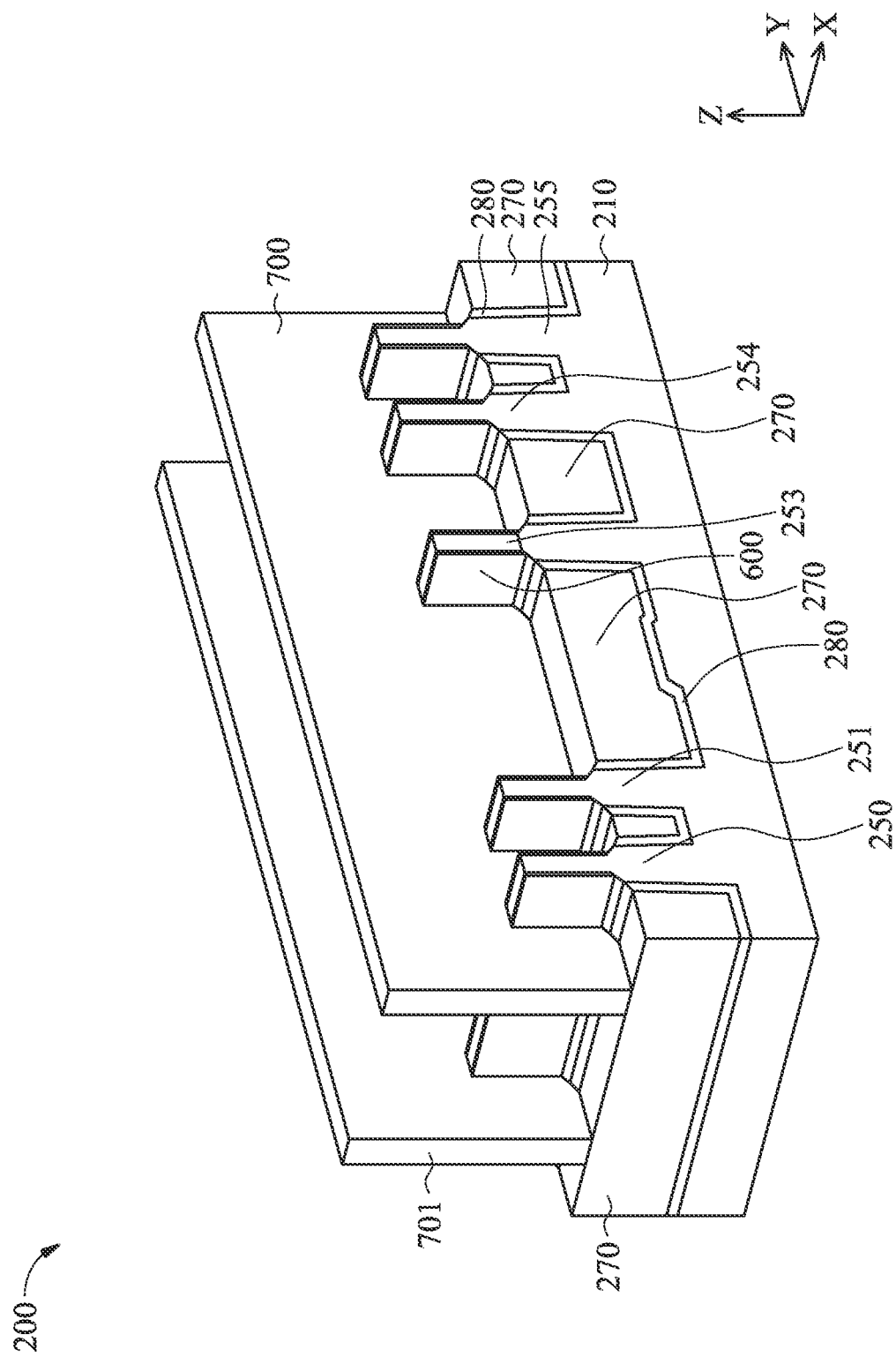

Referring now to FIG. 14, a plurality of gate structures, such as gate structures 700 and 701, may be formed over the fin structures 250-255. For example, the gate structures 700-701 may each include a high-k gate dielectric and a metal gate electrode. A high-k dielectric material is a material having a dielectric constant that is greater than a dielectric constant of SiO2, which is approximately 4. In an embodiment, the high-k gate dielectric includes hafnium oxide (HfO2), which has a dielectric constant that is in a range from approximately 18 to approximately 40. In alternative embodiments, the high-k gate dielectric may include ZrO2, Y2O3, La2O5, Gd2O5, TiO2, Ta2O5, HfErO, HfLaO, HfYO, HfGdO, HfAlO, HfZrO, HfTiO, HfTaO, or SrTiO. The dielectric layer 600, serving as the interfacial layer herein, is disposed between the gate dielectric and the fin structures 250-255. Note that while portions of the dielectric layer 600 remain on the sidewalls of the fin structures 250-255 in FIG. 14, the portion of the dielectric layer 600 located over/above the fin structures 250-255 are removed during a dummy gate etch process, and thus no portions of the dielectric layer 600 are shown above the fin structures in FIG. 14.

The metal gate electrode may include a work function metal component and a fill metal component. The work functional metal component is configured to tune a work function of its corresponding FinFET to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the functional gate structure. In various embodiments, the fill metal component may contain Aluminum (Al), Tungsten (W), Copper (Cu), or combinations thereof.

In some embodiments, the formation of the gate structures 700-701 may include a gate replacement process. In the gate replacement process, a dummy gate electrode (e.g., containing polysilicon) is formed initially and is then replaced later by the metal gate electrode. In some embodiments of the gate replacement process, a dummy gate dielectric (e.g., containing silicon oxide) may also be formed initially then then replaced later by the high-k gate dielectric. It is understood that the gate structures 700-701 may be surrounded by an interlayer dielectric (ILD) that is also formed over the isolation structures 270 and over the fin structures 250-255. The ILD is not illustrated herein so that the gate structures 700-701 can be seen more clearly. It is also understood that the formation of the gate structures 700-701 may involve a plurality of process steps that are not the focus of the present disclosure, and hence they are not discussed in detail herein. Additional processes (e.g., interconnect structure formation, packaging, testing, etc.) may be performed to complete the fabrication of the semiconductor device 200 after the formation of the gate structures 700-701, which are also not discussed herein in detail for reasons of simplicity.

Figure 15A:
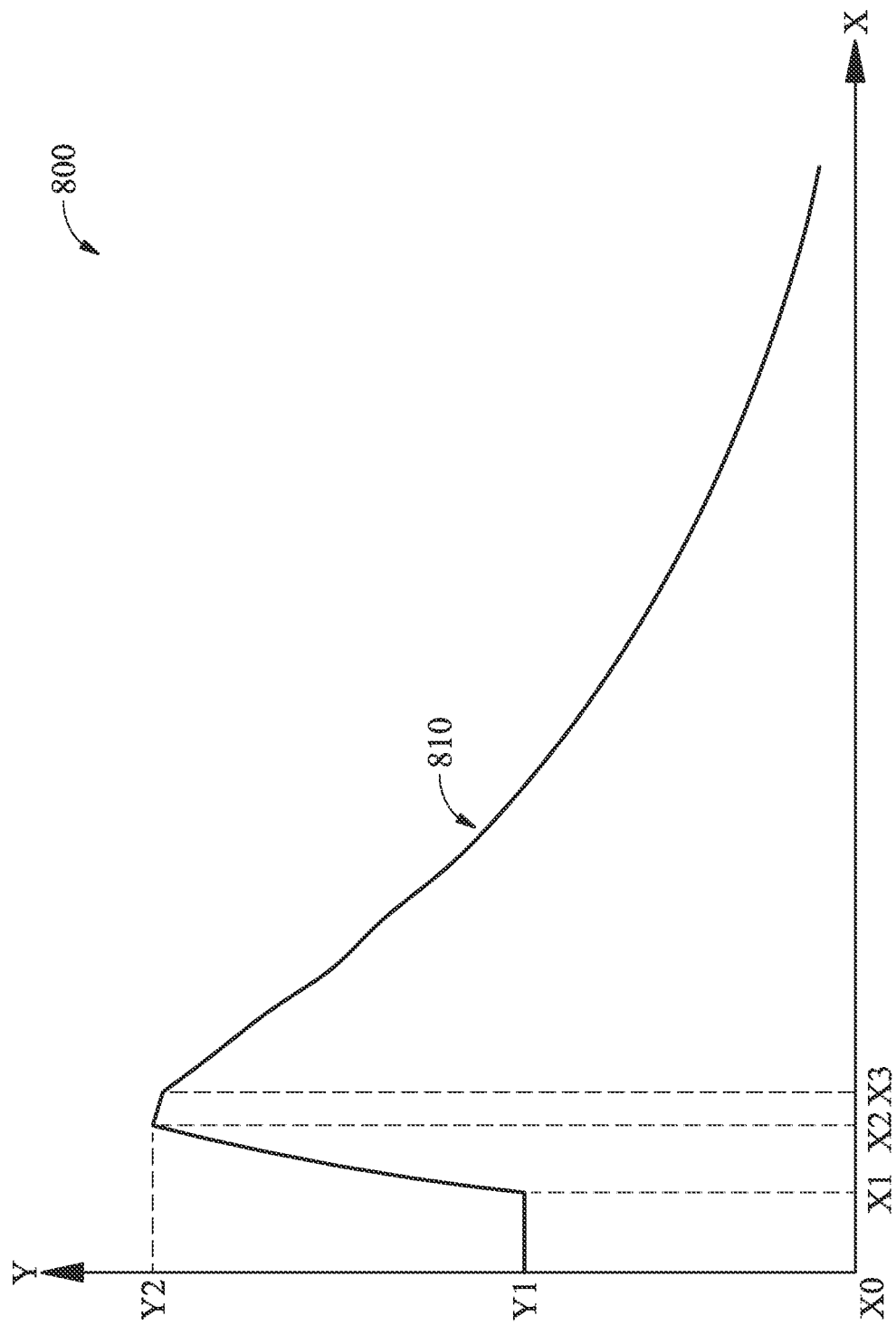
FIG. 15A illustrates a plot of a spike annealing process according to an embodiment of the present disclosure.

FIG. 15A illustrates a graph 800 that contains a plot 810 of an embodiment of the spike annealing process 550 discussed above. The X-axis of the graph 800 represents time, for example with a unit of second. The Y-axis of the graph 800 represents temperature, for example with a unit of degree Celsius. Thus, the plot 810 represents how the temperature of the spike annealing process varies over time. At time=X0, the annealing temperature is maintained at Y1, which is below the peak temperature. In some embodiments, Y1=600 degrees Celsius. At time=X1, the temperature of the annealing process begins to jump or is ramped up rapidly. In some embodiments, the rapid ascension of the temperature (vs time) has a slope in a range between about 90 degrees Celsius per second and about 110 degrees Celsius per second, for example about 100 degrees Celsius per second. The ramping up of the temperature continues until a peak annealing temperature of Y2 is reached at time=X2. In some embodiments, the peak temperature Y2 is greater than 800 degrees Celsius but is less than 900 degrees Celsius, for example between about 810 degrees Celsius and about 840 degrees Celsius. The peak temperature Y2 is mostly maintained (e.g., a minor drop off of a few degrees is permitted) until time=X3. That is, the peak temperature duration (in which the peak temperature of Y2 is maintained) is equal to X3–X2. In some embodiments, the duration of X3–X2 is in a range between about 1 second and about 10 seconds, for example between about 1.5 seconds and about 3 seconds. After X3, the temperature begins to drop, but at a rate that is slower than the rate for which it is ramped up. Again, the characteristics of the annealing process are specifically configured to achieve various goals such as repairing the fin structures 252-253 (e.g., by removing the germanium oxide) and/or thickening the silicon cap layer 500.

Figure 15B:
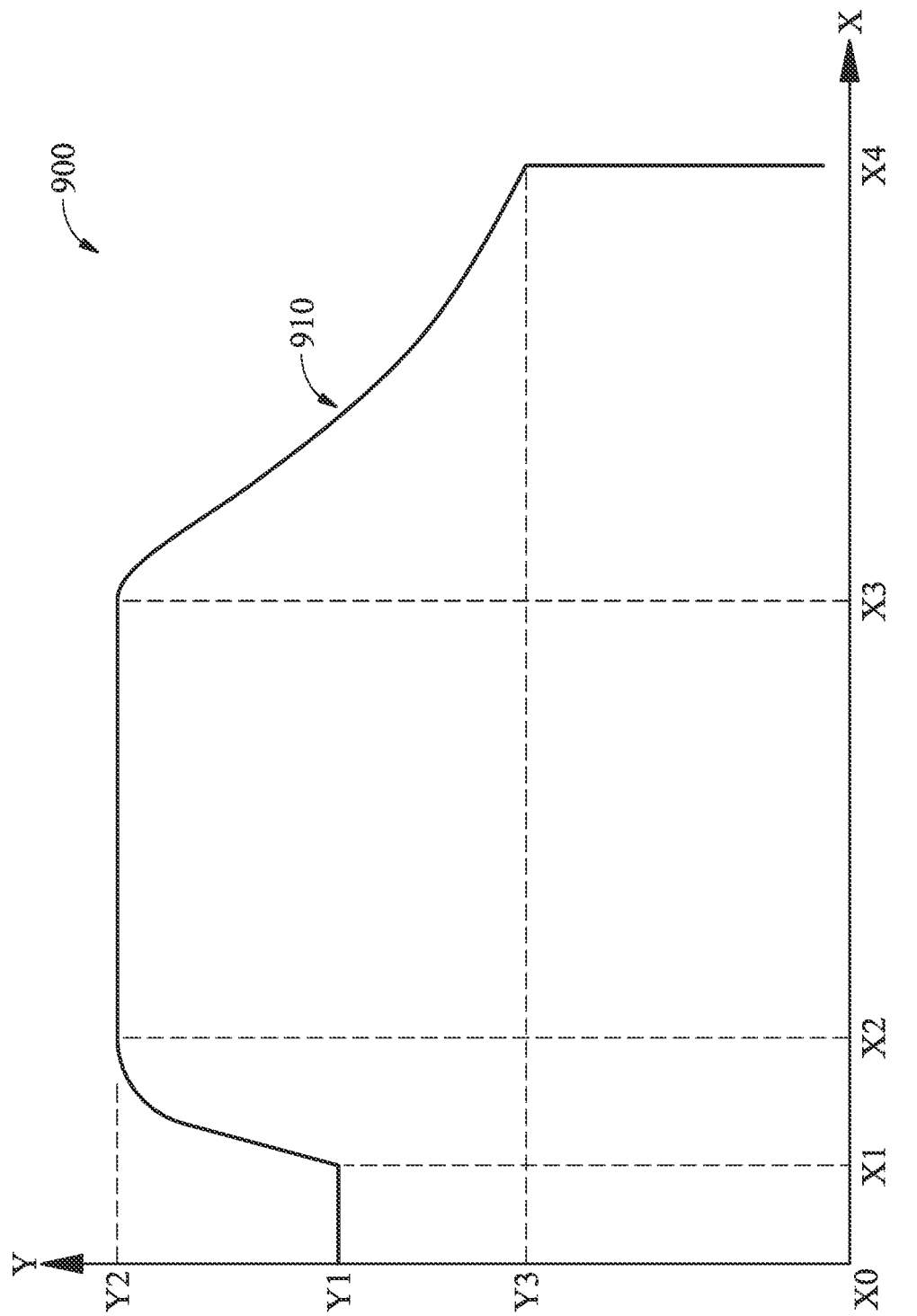
FIG. 15B illustrates a plot of a soak annealing process according to an embodiment of the present disclosure.

FIG. 15B illustrates a graph 900 that contains a plot 910 of an embodiment of the soak annealing process 550 discussed above. The X-axis of the graph 900 represents time, for example with a unit of second. The Y-axis of the graph 900 represents temperature, for example with a unit of degree Celsius. Thus, the plot 910 represents how the temperature of the soak annealing process varies over time. At time=X0, the annealing temperature is maintained at Y1, which is below the peak temperature. In some embodiments, Y1=300 degrees Celsius. At time=X1, the temperature of the annealing process begins to increase, but at a rate much lower than when the temperature is ramped up in the spike annealing process. In some embodiments, the increase of the temperature (vs time) has a slope in a range between about 10 degrees Celsius per second and about 20 degrees Celsius per second, for example about 14 degrees Celsius per second. The ramping up of the temperature continues until a peak annealing temperature of Y2 is reached at time=X2. In some embodiments, the peak temperature Y2 is greater than 350 degrees Celsius but is less than 450 degrees Celsius, for example between about 375 degrees Celsius and about 425 degrees Celsius. The peak temperature Y2 is mostly maintained (e.g., a minor drop off of a few degrees is permitted) until time=X3. That is, the peak temperature duration (in which the peak temperature of Y2 is maintained) is equal to X3–X2. The peak temperature duration of the soak annealing process is much longer than that of the spike annealing process. In some embodiments, the duration of X3–X2 is in a range between about 50 seconds and about 200 seconds, for example between about 100 seconds and about 150 seconds. After time X3, the temperature is ramped down gradually, until time X4 is reached, where the temperature has dipped to Y3. In some embodiments, Y3 is in a range between 175 degrees Celsius and 225 degrees Celsius. After time X4, the tool may be turned off, and the temperature drops sharply below Y3. Though the annealing profile for the soak annealing process is different from that of the spike annealing process, they both achieve the same effect, for example with respect to repairing the fin structures 252-253 by removing the germanium oxide and/or thickening the silicon cap layer 500.

Figure 17:
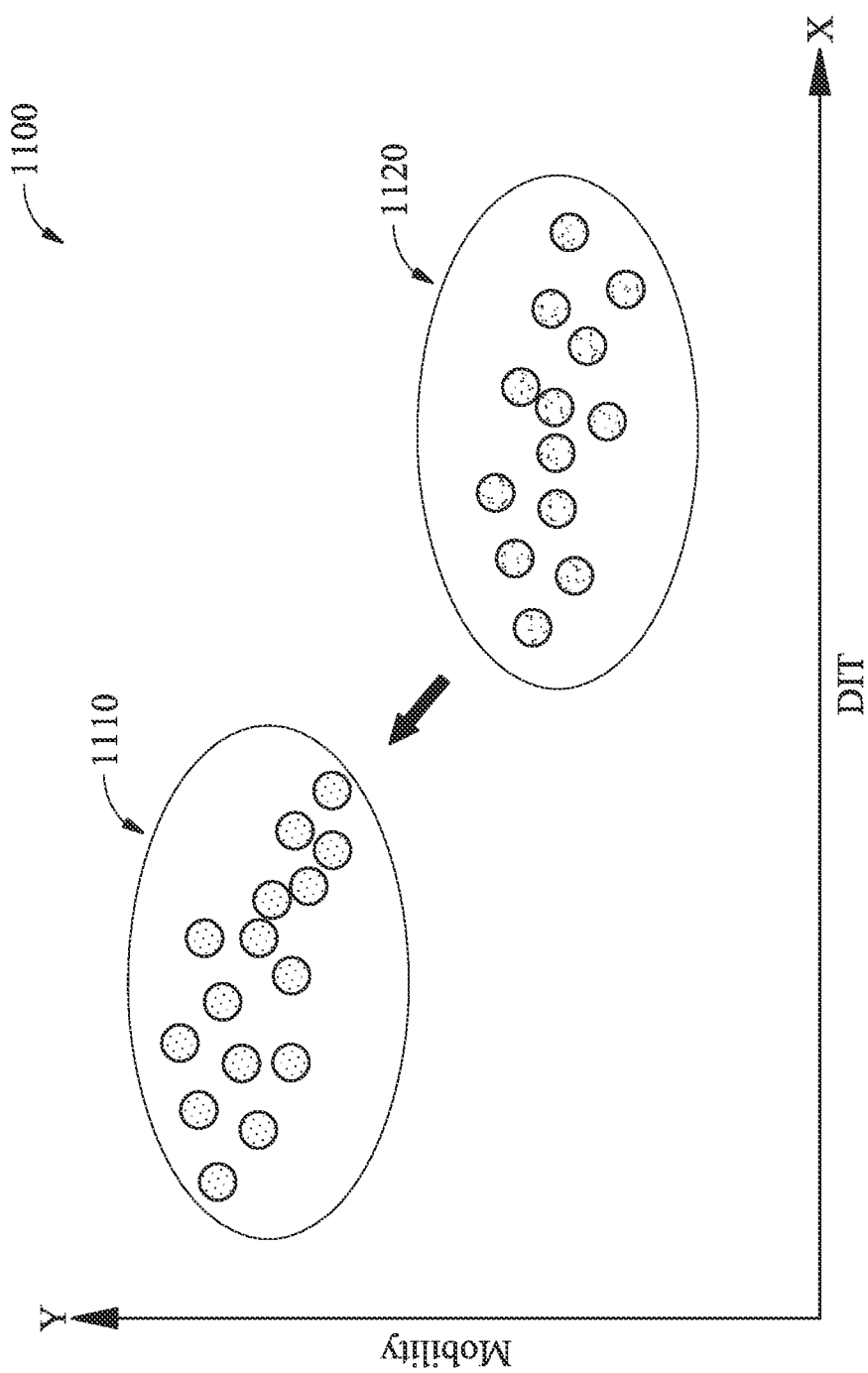
FIG. 17 illustrates a graph showing a mobility improvement and defect reduction according to an embodiment of the present disclosure

FIG. 17 is a graph 1100 that illustrates a mobility improvement and a defect reduction according to embodiments of the present disclosure. The graph 1100 includes a horizontal X-axis and a vertical Y-axis. The X-axis corresponds to wafer defects, for example density of interface trap (DIT). The Y-axis corresponds to carrier mobility. Two groups of wafer samples are illustrated in FIG. 17. The group of wafer samples 1110 are wafer samples where the wafers are fabricated according to the methods of the present disclosure discussed in detail above. The group of wafer samples 1120 are wafer samples where the wafers are fabricated according to conventional processes. As shown in FIG. 17, the group of wafer samples 1110 not only have fewer wafer defects compared to the group of wafer samples 1120, but also higher mobility. Alternatively stated, by performing the processes of the present disclosure, the wafer samples may be "moved" from the bottom right of the graph 1100 (where defects are greater but mobility is smaller) to the top left of the graph 1100 (where defects are fewer but mobility is higher).

Figure 18:
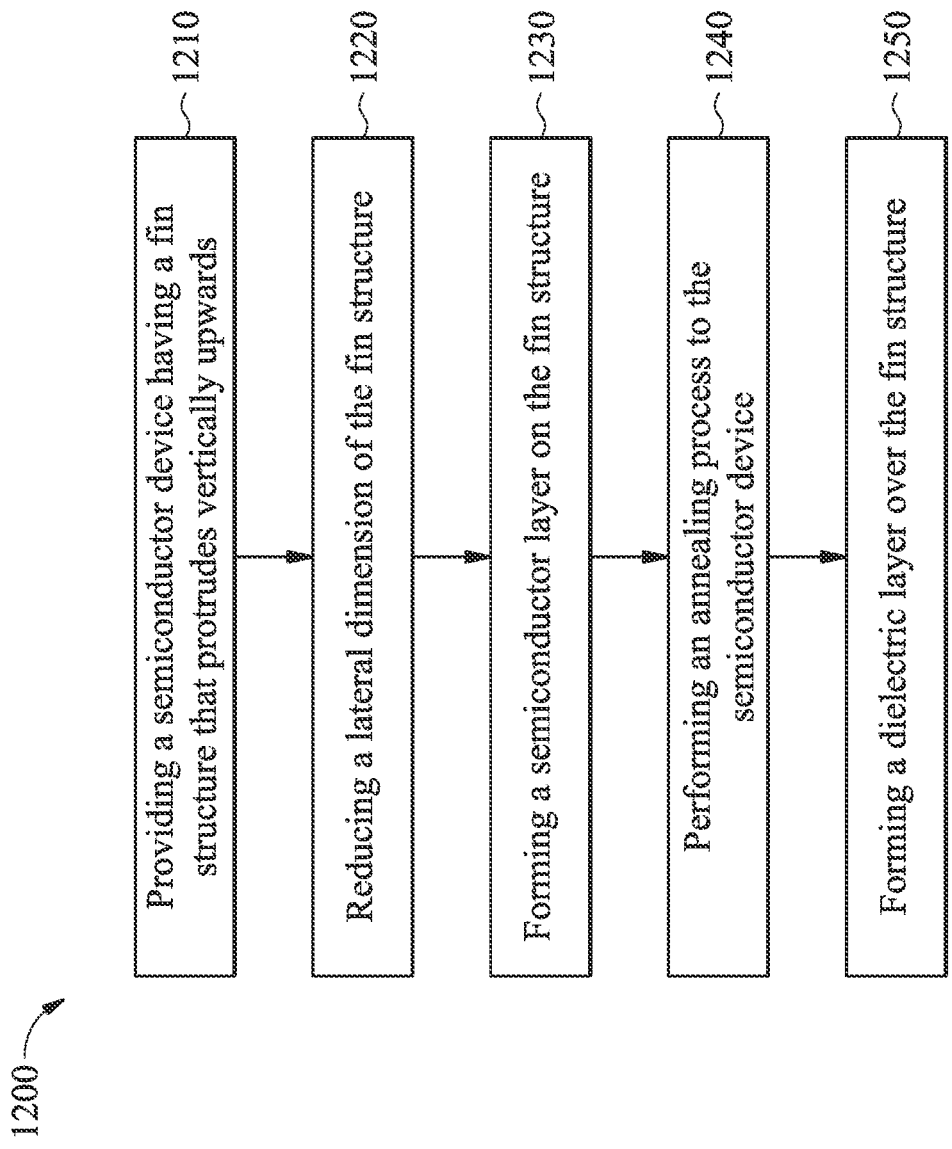
FIG. 18 is a flowchart illustrating a method of fabricating a FinFET device according to an embodiment of the present disclosure.

FIG. 18 is a flowchart illustrating a method 1200 according to an embodiment of the present disclosure. The method 1200 includes a step 1210, in which a semiconductor device is provided. The semiconductor device includes a fin structure that protrudes vertically upwards.

The method 1200 includes a step 1220, in which a lateral dimension of the fin structure is reduced.

The method 1200 includes a step 1230, in which a semiconductor layer is formed on the fin structure.

The method 1200 includes a step 1240, in which an annealing process is performed to the semiconductor device.

The method 1200 includes a step 1250, in which a dielectric layer is formed over the fin structure.

In some embodiments, a surface of the fin structure has a first roughness after the lateral dimension is reduced in step 1220, and the surface of the fin structure has a second roughness less than the first roughness after the annealing process is performed in step 1240.

In some embodiments, germanium oxide is formed at an interface between the fin structure and the semiconductor layer before the annealing process is performed in step 1240, and the annealing process of step 1240 reduces the germanium oxide.

In some embodiments, the annealing process of step 1240 thickens the semiconductor layer.

In some embodiments, the semiconductor device comprises a fin structure that contains silicon germanium, and a silicon layer is epitaxially grown as the semiconductor layer, and at least a portion of the semiconductor layer is oxidized into the dielectric layer.

In some embodiments, the annealing process comprises a spike annealing process. In some embodiments, the spike annealing process is performed with an annealing temperature in a range between about 800 degrees Celsius and about 900 degrees Celsius, with an annealing time in a range between about 1 second and about 10 seconds, and with an annealing pressure in a range between about 50 torrs and about 760 torrs.

In some embodiments, the annealing process comprises a soak annealing process. In some embodiments, the soak annealing process is performed with an annealing temperature in a range between about 300 degrees Celsius and about 450 degrees Celsius, with an annealing time in a range between about 50 seconds and about 200 seconds, and with an annealing pressure in a range between about 50 torrs and about 760 torrs.

It is understood that additional processes may be performed before, during, or after the steps 1210-1250 of the method 1200. For example, the method 1200 may include a step of forming a gate structure over the fin structure, wherein the dielectric layer serves as an interfacial layer of the gate structure. For reasons of simplicity, other additional steps are not discussed herein in detail.

In summary, the present disclosure performs a carefully tuned annealing process after the formation of the silicon cap layer and before the oxidation of the silicon cap layer. The annealing process reduces the germanium oxide content at the interface between the PFET fin structures and the silicon cap layer by causing the germanium to diffuse out of the semiconductor device. This mechanism also effectively thickens the silicon cap layer. The annealing process also repairs the rough fin surfaces by rearranging the atoms on the fin surfaces. After the annealing process is performed, an oxidation process is performed to oxidize the (now thickened) silicon cap layer, in order to form an interfacial layer to be used as a part of a gate structure of the FinFET transistor.

Based on the above discussions, it can be seen that the present disclosure offers advantages over conventional FinFET fabrication. It is understood, however, that other embodiments may offer additional advantages, and not all advantages are necessarily disclosed herein, and that no particular advantage is required for all embodiments. One advantage is that the present disclosure improves the fin structure quality. For example, without the performance of the annealing process herein, the fin structures may have roughened surfaces, which may lead to high resistivity and low carrier mobility, etc. Here, the annealing process rearranges the atoms on the surfaces of the fin structures, which smoothens out the fin structures. The smoother fin structures have better carrier mobility and lower resistivity. The smoother fin structures also mean better LWR and LER. As another example, the germanium oxide formed at an interface between the fin structures and the silicon cap layer may lead to density of interface trap (DIT) defects. Here, the annealing process provides extra energy to help break up the bonds between the germanium and oxygen, and the germanium may diffuse out of the semiconductor device, and oxygen may bond with silicon at the outer surfaces of the silicon cap layer. The reduction in germanium oxide reduces the DIT defects, as well as thickens the silicon cap layer, so that the silicon cap layer can be better served as a layer to be oxidized subsequently to form the interfacial layer of a gate structure. Other advantages include compatibility with existing FinFET fabrication, so the present disclosure is therefore easy and convenient to implement.

One aspect of the present disclosure pertains to a method of fabricating a semiconductor device. A semiconductor device is provided. The semiconductor device has a fin structure that protrudes vertically upwards. A lateral dimension of the fin structure is reduced. A semiconductor layer is formed on the fin structure after the reducing of the lateral dimension. An annealing process is performed to the semiconductor device after the forming of the semiconductor layer. A dielectric layer is formed over the fin structure after the performing of the annealing process.

Another one aspect of the present disclosure pertains to a method of fabricating a semiconductor device. A semiconductor device is provided. The semiconductor device has a fin structure that protrudes vertically upwards. A fin trimming process is performed to reduce a lateral dimension of the fin structure. The fin structure has roughened surfaces after the fin trimming process. A silicon cap layer is formed on the fin structure after the fin trimming process has been performed. The semiconductor device is annealed after the silicon cap layer has been formed. The fin structure has less roughened surfaces after the annealing. At least a portion of the silicon cap layer is converted into a dielectric layer after the annealing.

Yet another aspect of the present disclosure pertains to a semiconductor device. The semiconductor device includes a substrate that contains a semiconductive material. A fin structure protrudes out of the substrate. The fin structure is a fin structure for a p-type FinFET transistor. A silicon cap layer is disposed on the fin structure. A dielectric layer is disposed on the silicon cap layer. The fin structure has a line width roughness (LWR) between about 1.7 nanometers (nm) and about 1.9 nm. The fin structure has a line edge roughness (LER) between about 1.5 nanometers (nm) and about 1.7 nm.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A semiconductor device, comprising:
a substrate that contains a semiconductive material;
a fin structure that protrudes out of the substrate, wherein the fin structure is a fin structure for a p-type FinFET transistor;
a silicon cap layer disposed on the fin structure, wherein the silicon cap layer is a single continuous structure, wherein a first segment of the silicon cap layer is disposed directly on an upper surface of the fin structure, wherein a second segment of the silicon cap layer is disposed directly on a side surface of the fin structure, and wherein the first segment and the second segment have a same material composition; and
a gate dielectric layer disposed over the silicon cap layer; wherein:
the fin structure has a line width roughness (LWR) between about 1.7 nanometers (nm) and about 1.9 nm; or
the fin structure has a line edge roughness (LER) between about 1.5 nanometers (nm) and about 1.7 nm;
the fin structure has an average width Finwidth-average;
a ratio of LWR:Fin_width_average is in a range between about 1:4 and about 1:5; and
a ratio of LER:Fin_width_average is in a range between about 1:4 and about 1:5.

2. The semiconductor device of claim 1, wherein a portion of the silicon cap layer has an amorphous silicon material composition.

3. The semiconductor device of claim 1, wherein the silicon cap layer has a thickness in a range between about 7 angstroms and about 15 angstroms.

4. The semiconductor device of claim 1, wherein an entirety of the silicon cap layer is oxidized.

5. The semiconductor device of claim 1, wherein the silicon cap layer includes an unoxidized portion and an oxidized portion disposed over the unoxidized portion.

6. The semiconductor device of claim 1, wherein the fin structure contains silicon germanium.

7. The semiconductor device of claim 1, wherein the fin structure is substantially free of germanium oxide.

8. The semiconductor device of claim 1, further comprising an interfacial layer disposed on the silicon cap layer and below the gate dielectric layer, wherein the interfacial layer contains a dielectric material.

9. The semiconductor device of claim 8, further comprising a metal-containing gate electrode disposed over the gate dielectric layer.

10. The semiconductor device of claim 8, further comprising an isolation structure that surrounds a bottom portion of the fin structure, wherein the isolation structure and the interfacial layer each contains silicon oxide.

11. The semiconductor device of claim 10, wherein the silicon oxide of the isolation structure has more impurities than the silicon oxide of the interfacial layer.

12. A semiconductor device, comprising:
a substrate that contains a semiconductive material;
a fin structure that extends vertically out of the substrate, wherein the fin structure contains silicon germanium;
an isolation structure that surrounds a lower segment of the fin structure, wherein the isolation structure has a dielectric material composition;
a silicon-containing cap layer disposed over an upper segment of the fin structure; and
a gate dielectric layer disposed over the silicon cap layer; wherein:
the fin structure has a line width roughness (LWR), a line edge roughness (LER) different from the LWR, and an average width Fin_width_average that is different from the LWR and the LER;
a ratio of LWR:Finwidthaverage is in a range between about 1:4 and about 1:5; and
a ratio of LER:Fin_width_average is in a range between about 1:4 and about 1:5;
wherein:
the LWR is in a range between about 1.7 nanometers (nm) and about 1.9 nm; and
the LER is in a range between about 1.5 nanometers (nm) and about 1.7 nm;
the fin structure is free of germanium oxide; and
at least an outer portion of the silicon-containing cap layer is oxidized.

13. The semiconductor device of claim 12, wherein the silicon-containing cap layer has a thickness in a range between about 7 angstroms and about 15 angstroms.

14. The semiconductor device of claim 12, further comprising:
an interfacial layer disposed on the silicon-containing cap layer, wherein the interfacial layer has a same dielectric material composition as the isolation structure;
a gate dielectric layer disposed over the interfacial layer, wherein the gate dielectric layer includes a high-k gate dielectric material; and
a metal-containing gate electrode disposed over the gate dielectric layer.

15. The semiconductor device of claim 14, wherein the isolation structure contains more impurities than the interfacial layer.

16. A semiconductor device, comprising: a substrate that contains a semiconductive material;
a fin structure of a P-type transistor that extends vertically out of the substrate, wherein the fin structure contains silicon germanium and is free of germanium oxide;
an isolation structure that surrounds a lower segment of the fin structure, wherein the isolation structure has a dielectric material composition;
a semiconductor-containing cap layer disposed over an upper segment of the fin structure;
an interfacial dielectric layer disposed over the semiconductor-containing cap layer; and
a gate dielectric layer disposed over the silicon cap layer; wherein:
the fin structure has a line width roughness (LWR), a line edge roughness (LER) different from the LWR, and an average width Fin_width_average that is different from the LWR and the LER;
a ratio of LWR:Fin_width_average is in a range between about 1:4 and about 1:5;
a ratio of LER:Fin_width_average is in a range between about 1:4 and about 1:5;
the LWR is in a range between about 1.7 nanometers (nm) and about 1.9 nm; and
the LER is in a range between about 1.5 nanometers (nm) and about 1.7 nm; and the semiconductor-containing cap layer has a thickness in a range between about 7 angstroms and about 15 angstroms.

17. The semiconductor device of claim 16, wherein:
at least an outer portion of the semiconductor-containing cap layer is oxidized; and the interfacial dielectric layer has a same material composition as the isolation structure, but the isolation structure contains more impurities than the interfacial dielectric layer.

* * * * *